United States Patent

Iwamura et al.

[11] Patent Number: 5,623,459
[45] Date of Patent: Apr. 22, 1997

[54] METHOD AND APPARATUS FOR ERROR CORRECTING REPRODUCED DATA

[75] Inventors: Ryuichi Iwamura; Shozo Masuda, both of Tokyo; Yoshiyuki Akiyama, Kanagawa, all of Japan

[73] Assignee: Sony Corporation, Tokyo, Japan

[21] Appl. No.: 436,437

[22] PCT Filed: Sep. 28, 1994

[86] PCT No.: PCT/JP94/01604

§ 371 Date: May 24, 1995

§ 102(e) Date: May 24, 1995

[87] PCT Pub. No.: WO95/09421

PCT Pub. Date: Apr. 6, 1995

[30] Foreign Application Priority Data

Sep. 29, 1993 [JP] Japan .................................. 5-242532

[51] Int. Cl.$^6$ .................................................. G11B 7/00
[52] U.S. Cl. ..................... 369/32; 369/54; 369/53
[58] Field of Search ........................ 369/59, 54, 58, 369/32, 44-28, 60, 124, 53, 49

[56] References Cited

U.S. PATENT DOCUMENTS

| | | | |
|---|---|---|---|
| 4,541,093 | 9/1985 | Furuya et al. | 369/49 |
| 4,604,655 | 8/1986 | Moriyama | 369/49 |
| 4,729,043 | 3/1988 | Worth | 269/59 |
| 4,791,622 | 12/1988 | Clay et al. | 269/59 |
| 5,291,469 | 3/1994 | Yoshinaka | 369/69 |
| 5,331,616 | 7/1994 | Morita et al. | 369/53 |
| 5,471,450 | 11/1995 | Yonemitsu et al. | 369/60 |

FOREIGN PATENT DOCUMENTS

| | | |
|---|---|---|
| 0073519 | 3/1983 | European Pat. Off. . |
| 0191410 | 8/1986 | European Pat. Off. . |
| 0498501 | 8/1992 | European Pat. Off. . |
| 0552853 | 1/1993 | European Pat. Off. . |
| 62-52769 | 3/1987 | Japan . |
| 62-202364 | 9/1987 | Japan . |
| 62-249532 | 10/1987 | Japan . |
| 63-56875 | 3/1988 | Japan . |
| 63-157371 | 6/1988 | Japan . |
| 1-53554 | 11/1989 | Japan . |
| 3-160670 | 7/1991 | Japan . |
| 3-290878 | 12/1991 | Japan . |
| 4-67473 | 3/1992 | Japan . |
| 4-188472 | 7/1992 | Japan . |
| 5-2840 | 1/1993 | Japan . |
| 5-2839 | 1/1993 | Japan . |
| 5-109206 | 4/1993 | Japan . |
| 5-225713 | 9/1993 | Japan . |

Primary Examiner—Nabil Hindi
Attorney, Agent, or Firm—William S. Frommer; Alvin Sinderbrand

[57] ABSTRACT

Data is recorded onto optical disc 1 with double parity of inner parity and outer parity being added thereto. Inner parity is added to data which has been caused to undergo interleaving processing and is used for correction of inner code. Outer parity is added to data which is not caused to undergo interleaving processing and is used for correction of outer code. Reproduction data from optical disc 1 is delivered to ring buffer memory 5 and is stored thereinto. Further, the reproduction data is delivered also to error correcting circuit 71, at which outer code is corrected. Corrected result is delivered to ring buffer memory 5 and is overwritten thereat. Data stored in ring buffer memory 5 is read out to error correcting circuit 71 for a second time. Thus, inner code is corrected. Data caused to undergo outer code correction is used for detection of sector address in sector detecting circuit 72. At the time of special reproduction, only outer code correction is carried out.

18 Claims, 17 Drawing Sheets

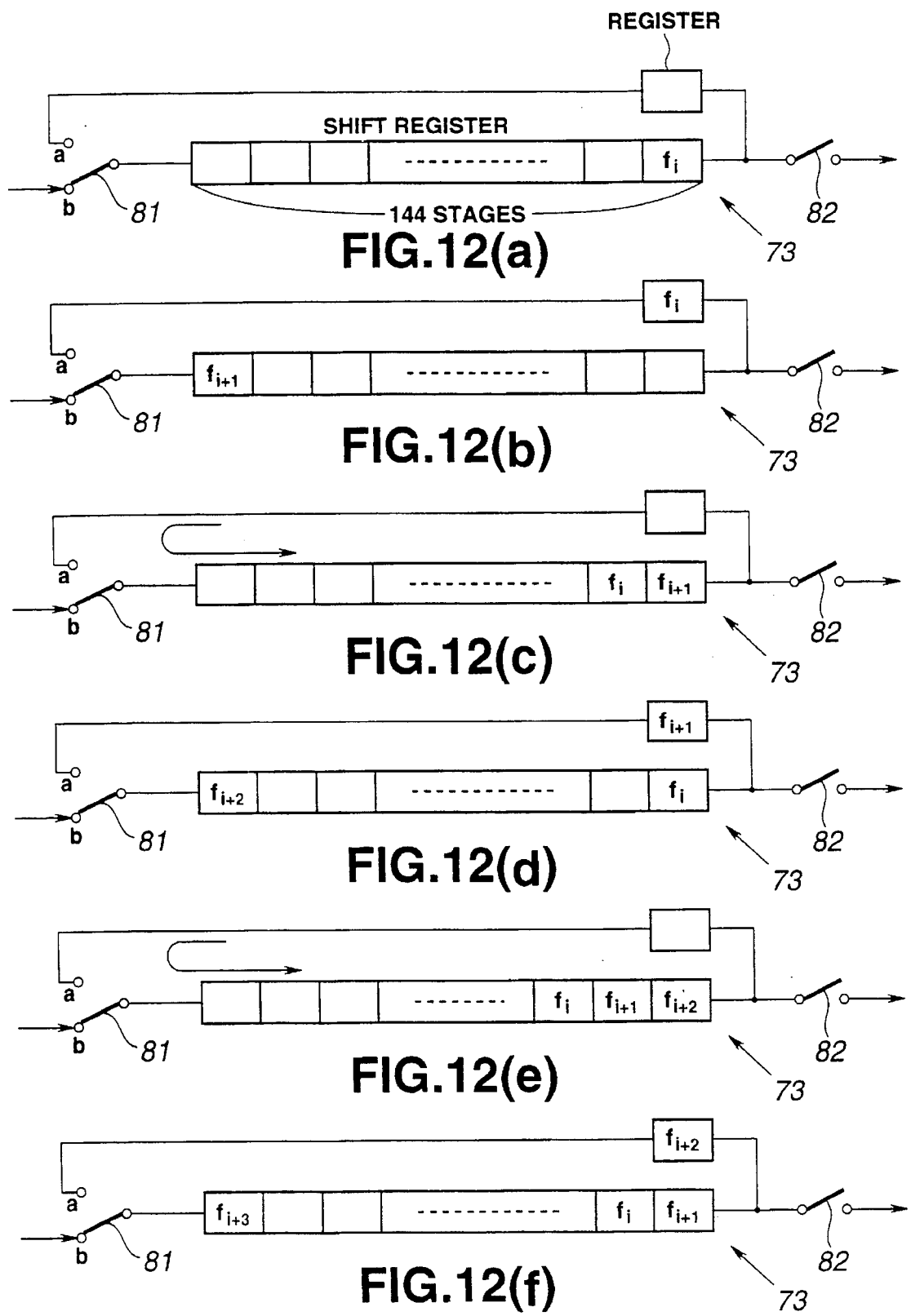

FIG.18 (a) ------ A24XA26A27A28XXA31(A32)A33XX ------
└─→ WRITE RESTART

FIG.18 (b) ------ XXA26A27A28XXA31(X)A33XX ------
↓
A32(INTERPOLATION)
└─→ WRITE RESTART

METHOD AND APPARATUS FOR ERROR CORRECTING REPRODUCED DATA

TECHNICAL FIELD

This invention relates to a data reproducing method and a data reproducing apparatus suitable when used in an optical disc apparatus or a magneto-optical disc apparatus adapted for reproducing picture data or speech data recorded on a disc, e.g., an optical disc or a magneto-optical disc, etc.

BACKGROUND ART

As an optical disc apparatus adapted for reproducing moving picture data or speech data recorded on a recording medium such as an optical disc, etc. by a picture compressing method in conformity with a predetermined standard, e.g., MPEG (Moving Picture Experts Group), etc., there is, e.g., an apparatus disclosed in the specification and drawings of EUROPEAN PATENT APPLICATION publication number: 0 522 853 A2 (Date of publication of application 13 January 1993. Bulletin 93/02) which has already field by the applicant of this application.

Namely, as shown in FIG. 1, in this optical disc apparatus, pick-up 2 irradiates laser beams onto optical disc 1 to reproduce, e.g., picture data recorded on optical disc 1 from its reflected light. Data that pick-up 2 outputs is inputted to demodulating circuit 3, at which it is demodulated. Moreover, output of pick-up 2 is inputted also to PLL (Phase Locked Loop) circuit 9. Thus, clock is extracted. This clock is sent to demodulating circuit 3 and sector detecting circuit 4. The data demodulated by the demodulating circuit 3 is inputted to error processing (ECC: Error Check and Correction) circuit 6 through sector detecting circuit 4.

In this example, sector detecting circuit 4 detects sector No., i.e., address allocated to sector of optical disc 1 from data demodulated at demodulating circuit 3 to output it to control circuit 31. Moreover, the sector detecting circuit 4 is operative so that when it fails to detect, e.g., sector No., or when even if it can detect those numbers e.g., are not continuous, it outputs sector No. abnormal condition signal to track jump judging circuit 7.

ECC circuit 6 detects data error from data delivered from demodulating circuit 3 through sector detecting circuit 4 to carry out error correction by using parity bit added to that data. Further, ECC circuit 6 is operative so that when it fails to correct error of data, it outputs error generation signal to track jump judging circuit 7. The error corrected data is delivered from ECC circuit 6 to ring buffer memory 5 for track jump, and is stored thereinto in accordance with control by control circuit The control circuit 31 reads addresses every respective sectors of optical disc 1 from output of sector detecting circuit 4 to designate write address, i.e., write point (WP) for storing data from ECC circuit 6 into ring buffer memory 5 in correspondence with that address. Moreover, the control circuit 31 designates read-out address, i.e., reproduction point (RP) of data written in ring buffer memory 5 on the basis of code request signal from video code buffer memory 10 of decode section 20 of the succeeding stage. Then, the control circuit 31 reads out data from the reproduction point (RP) to deliver the data thus read out into video code buffer memory 10 to store it thereinto.

Data stored in the video code buffer memory 10 is transferred to inverse VLC circuit 11 on the basis of code request signal from inverse VLC (Variable Length Coding) circuit 11 of the stage succeeding thereto. The inverse VLC circuit 11 allows data inputted thereto to undergo inverse VLC processing, whereby when inverse VLC processing of the inputted data is completed, it outputs that data to inverse quantizing circuit 12, and outputs code request signal to video code buffer 10 to make a request for input of new data. Further, the inverse VLC circuit 11 respectively outputs quantization step size and motion vector to inverse quantizing circuit 12 and motion compensating circuit 15.

The inverse quantizing circuit 12 inverse-quantizes inputted data in accordance with quantization step size delivered from the inverse VLC circuit 11 to output it to inverse DCT circuit 13. This inverse DCT (Discrete Cosine Transform) circuit 13 allows inputted data to undergo inverse DCT processing to deliver it to adding circuit 14.

In the case where data delivered from inverse DCT circuit 13 to adding circuit 14 is data of I picture, that data is outputted to frame memory 16 as it is through adding circuit 14, and is stored thereinto.

Moreover, in the case where corresponding data is data of P picture in which I picture in the MPEG system is used as predictive picture, already decoded data of I picture is read out from frame memory 16, and is delivered to motion compensating circuit 15. This motion compensating circuit 15 implements motion compensation corresponding to motion vector delivered from inverse VLC circuit 11 to the data delivered from frame memory 16 so that predictive picture is provided to deliver it to adding circuit 14. The adding circuit 14 adds data outputted from inverse DCT circuit 13 and data outputted from motion compensating circuit 15 to generate data of P picture. This data is also stored into memory 16.

In the case where data outputted from inverse DCT circuit 13 is data of B picture in the MPEG system, already decoded I picture or P picture data is read out from frame memory 16, and is then delivered to motion compensating circuit 15. The data delivered to the motion compensating circuit 15 is caused to undergo motion compensation thereat, and is then delivered to adding circuit 14. Since the adding circuit 14 adds data outputted from inverse DCT circuit 18 and data outputted from motion compensating circuit 15, decoded B picture data will be obtained. This data is also stored into frame memory 16.

Picture data decoded and stored into the frame memory 16 in this way are caused to undergo D/A conversion at D/A converter 17. Thereafter, such picture data are delivered to display 18, and are displayed thereon.

Meanwhile, as described above, control circuit 31 delivers, in correspondence with code request signal from video code buffer memory 10, data stored in ring buffer memory 5 to video code buffer memory 10. In this case, when, e.g., data processing relating to simple picture are continued and data transfer quantity from video code buffer memory 10 to inverse VLC circuit 11 is thus decreased, data transfer quantity from ring buffer memory 5 to video code buffer memory 10 is also decreased. Consequently, memory data quantity of ring buffer memory 5 is increased, resulting in the possibility that it may overflow.

For this reason, track jump judging circuit 7 calculates, from write point (WP) and reproduction point (RP) subject to control by control circuit 31, data quantity that ring buffer memory 5 currently stores, whereby in the case where that data quantity exceeds a predetermined reference value set in advance, it judges that ring buffer memory 5 may overflow to output track jump command to tracking servo circuit 8.

Moreover, the track jump judging circuit 7 is operative so that in the case where it detects sector No. abnormal condition signal from sector detecting circuit 4 or error generation signal from ECC circuit 6, it determines (calculates), from write point (WP) and reproduction point (RP) subject to control by control circuit 31, data quantity remaining within ring buffer memory 5. In addition, the track jump judging circuit 7 determines (calculates), from current track position, data quantity to allow ring buffer memory 5 not to underflow, which is required for guaranteeing read-out from ring buffer memory 5 to video code buffer memory 10.

In the case where remaining data quantity of ring buffer memory 5 is sufficiently large, even if data is read out from ring buffer memory 5 to video code buffer memory 10 at the maximum transfer rate, no underflow takes place in the ring buffer memory 5. For this reason, track jump judging circuit 7 reproduces, for a second time, error occurrence position by means of pick-up 2 to thereby judges that error recovery can be made to output track jump command to tracking servo circuit 8.

When track jump command is outputted by track jump judging circuit 7, tracking servo circuit 8 allows reproduction position by pick-up 2 to be subjected to track jump. Namely, in the case where data are recorded, e.g., from the inner circumference to the outer circumference of optical disc 1, tracking servo circuit 8 jumps pick-up 2 from current position to the adjacent track on the inner circumferential side. Then, for a time period during which reproduction position by pick-up 2 arrives at the original position as the result of the fact that optical disc 1 makes one rotation for a second time, i.e., for a time period until sector No. obtained from sector detecting circuit 4 becomes equal to sector No. at the time of track jump, writing into ring buffer memory 5 of new data is inhibited, and data already stored in the ring buffer memory 5 is transferred, as occasion demands, to video code buffer memory 10.

Moreover, even if sector No. obtained from sector detecting circuit 4 is in correspondence with sector No. at the time of track jump after track jump, in the case where quantity of data stored in ring buffer memory 5 is above a predetermined reference value, i.e., in the case where ring buffer memory 5 may overflow, writing of data into ring buffer memory 5 is not restarted, and track jump is carried out for a second time.

In this example, ring buffer memory 5 has a capacity capable of storing data of at least one track of optical disc 1.

Thus, in the case where optical disc 1 is, e.g., CLV (Constant Linear Velocity) disc, since rotation period is maximum at the outermost circumference, this optical disc 1 at least has a memory capacity corresponding to one track at the outermost circumference, i.e., memory capacity of (rotation period of the outermost circumference)×(data transfer rate from ECC circuit 6 to ring buffer memory 5).

Maximum transfer rate of data from ring buffer memory 5 to video code buffer memory 10 is set to a value equal to data transfer rate from ECC circuit 6 to ring buffer memory 5, or a value smaller than that value. By making such a setting, it is possible to freely send out code request of data transfer from video code buffer memory 10 to ring buffer memory 5 irrespective of timing of track jump.

As stated above, in accordance with the above-mentioned optical disc apparatus, since pick-up 2 is caused to undergo track jump in correspondence with memory capacity of ring buffer memory 5, overflow or underflow of video code buffer memory 10 is prevented irrespective of complexity or flatness of reproduction picture from optical disc 1. Thus, it is possible to reproduce picture of uniform picture quality for a long time.

Further, in accordance with the above-mentioned optical disc apparatus, in the case where any error takes place in data which has been read out from optical disc 1, since an approach is employed to allow pick-up 2 to undergo track jump to read out data from optical disc 1 for a second time, it is possible to prevent deterioration of reproduction picture by read-out error of data.

Meanwhile, ECC circuit 6 in the optical disc apparatus of FIG. 1 is constituted as shown in FIG. 2, for example. Data outputted from the above-described demodulating circuit 3 shown in FIG. 1 is inputted to ECC circuit 6 through sector detecting circuit 4, and is temporarily stored into buffer memory 41 of the input stage thereof. The data stored in the buffer memory 41 are sequentially transferred to memory 42 and are stored thereinto in accordance with address that address generator 43 generates. The data stored in the memory 42 are read out therefrom and are transferred to error correcting circuit 44. This error correcting circuit 44 implements error correction to the data transferred from the memory 42 to store the error-corrected data into the memory 42 for a second time.

Write and read operations of data with respect to memory 42 will now be described with reference to the memory map of FIG. 3. Circular mark in the figure indicates one symbol unit of error correction, ordinarily 1 byte. Write or read operation of data with respect to memory 42 is carried out in units where one row (line) in lateral direction of the memory map shown in FIG. 3 is caused to be one (unit) data length. Moreover, parity bits are added to the last portion to which slanting lines are attached in the figure, and respective parity bits as data of the last portion in arrangement of data in oblique direction (hereinafter described as "interleaving direction") of the memory map indicated by arrow of dotted line in the figure serves as parity bit for correcting error of the data arranged in the interleaving direction.

Namely, in order to allow, e.g., burst error to be isolated, data and parity bits for correcting error of that data are arranged in the interleaving direction.

Accordingly, in the memory 42, data from buffer memory 41 is first written in the address direction in accordance with address that write pointer wp1 points (indicates).

In this example, the address direction means a direction in which address is advanced from the left to the right and from the top to the bottom in the memory map of FIG. 3.

Data already written in memory 42 is read out in the interleaving direction at least in accordance with address that read pointer rp1, which is delayed by memory capacity necessary for reading out data in the interleaving direction (hereinafter described as interleaving length) points (indicates), and is delivered to error correcting circuit 44. At this error correcting circuit 44, error correction processing is implemented to arrangement of data in the interleaving direction in a manner as described above. Thus, the error corrected data is transferred to memory 42.

The data which has been error-corrected in the error correcting circuit 44 is written for a second time at address position initially written in accordance with address that write pointer wp2 points (indicates), and is transferred to buffer memory 45 in accordance with read pointer rp2 moving in the address direction.

The above-mentioned operation is caused to be one cycle to repeat such a cycle so that error-corrected data are sequentially outputted from buffer memory 45 to ring buffer memory 5.

Accordingly, error-corrected data is once (temporarily) stored into memory 42 and is stored into ring buffer memory 5 for a second time.

As stated above, in the conventional optical disc apparatus, there is carried out a redundant operation such that data are sequentially outputted from different two memories, i.e., memory 42 and ring buffer memory 5 and are inputted thereto. As a result, there were the problems that not only scale of the apparatus becomes large, but also data processing speed becomes lower.

In view of the above, the applicant of this application has already proposed, in EUROPEAN PATENT APPLICATION Publication number 0 590 881 A2 (Date of publication: 06 April 1994 Bulletin 94/14), a system for correcting error of data stored in the ring buffer memory 5.

However, in the above-mentioned proposed system, correct sector address could not be read, thus disadvantageously failing to precisely and quickly provide an access to optical disc 1.

Further, there was the problem that in the case where correction is impossible because there is great error in data which has been read from optical disc 1, it is impossible to make correction for a second time.

In addition, there was the problem that it takes much time in de-interleaving operation, so high speed reproducing operation is difficult at the time of special reproduction, such as, for example, fast feed or rewinding.

This invention has been made in view of such circumstances, and contemplates providing an ability to quickly make an access to the disc, and providing an ability to reproduce the disc at a higher speed.

In addition, this invention contemplates improving error correcting ability.

DISCLOSE OF THE INVENTION

This invention is directed to a data reproducing method for reproducing recording data recorded on a disc, characterized in that the method comprises the steps of: reproducing the recording data through a pick-up from the disc on which the recording data including two systems (kinds) of error correction codes are recorded; storing the reproduced data into a memory; carrying out, at least by using data read out from the memory, error correction with respect to data stored in the memory by the two systems of error correction codes; allowing the pick-up to undergo track jump in correspondence with memory quantity of data of the memory or detection of error correction inability; and decoding the data read out from the memory.

The data reproducing method according to this invention is characterized in that the two systems of error correction codes are a first error correction code added to data obtained by allowing data recorded on the disc to undergo interleaving processing and a second error correction code added to data obtained by allowing the data recorded on the disc not to undergo interleaving processing.

Moreover, the data reproducing method according to this invention is characterized in that in the case where the above-mentioned error correction inability is detected, error correction inability portion of data stored in the memory is corrected for a second time by the above-mentioned first error correction code and/or the second error correction code.

Further, the data reproducing method according to this invention is characterized in that syncs (synchronizing signals) are allocated every data of a predetermined length including the two systems of error correction codes, and write operation of data into the memory, correction of error using the two systems of error correction codes of data written into the memory, and read-out operation for decoding are carried out within reproduction period of the sync.

Furthermore, the data reproducing method according to this invention is characterized in that the two systems of error correction codes are product code.

Moreover, this invention is directed to a data reproducing method for reproducing recording data recorded on a disc, characterized in that the method comprises the steps of: reproducing the recording data from the disc on which the recording data including a first error correction code added to data which has been caused to undergo interleaving processing and a second error correction code added to data which is not caused to undergo interleaving processing are recorded; and carrying out error correction with respect to the reproduced data by using only the second error correction code at the time of special reproduction.

Further, this invention is directed to a data reproducing method for reproducing recording data recorded on a disc, characterized in that the method comprises the steps of: reproducing the recording data from the disc on which the recording data including two systems of error correction codes calculated so as to include sector header are recorded; carrying out error correction by using only one system of the two systems of error correction codes with respect to the reproduced data; and detecting sector address from sector header from the error corrected data.

The data reproducing method according to this invention is characterized in that the method comprises a step of setting valid time period and invalid time period on the basis of continuity of valid sector address within the detected sector address to interpolate the sector address in the case where the valid sector address is not detected within the valid time period.

Moreover, this invention is directed to a data reproducing method for reproducing recording data recorded on a disc, characterized in that the method comprises the steps of: reproducing the recording data from the disc on which the recording data including a first error correction code added to data which has been caused to undergo interleaving processing and a second error correction code added to data which is not caused to undergo interleaving processing are recorded; writing the reproduced data into a DRAM (Dynamic Random Access Memory) so that the first error correction code and the second error correction code have directions perpendicular to each other; carrying out error correction with respect to data stored in the DRAM by the first error correction code and the second error correction code at least by using data which has been read out from the DRAM; and decoding the data which has been read out from the DRAM.

Further, this invention is directed to a data reproducing apparatus adapted for reproducing recording data recorded on a disc, characterized in that the apparatus comprises: reproducing means for reproducing the recording data from the disc on which the recording data including two systems of error correction codes are recorded; a memory for storing the reproduced data; error correcting means for carrying out error correction with respect to data stored in the memory by the two systems of error correction codes at least by using data which has been read out from the memory; control means for controlling read-out position with respect to the disc of the reproducing means in correspondence with memory quantity of data of the memory or detection of error correction inability; and decoding means for decoding data which has been read out from the memory.

The data reproducing apparatus according to this invention is characterized in that the two systems of error correction codes are a first error correction code added to data obtained by allowing the data recorded on the disc to undergo interleaving processing and a second error correction code added to data obtained by allowing the data recorded on the disc not to undergo interleaving processing.

Moreover, the data reproducing apparatus according to this invention is characterized in that in the case where the error correction inability is detected, the error correcting means corrects, for a second time, error correction inability portion of data stored in the memory by the first error correction code and/or the second error correction code.

Further, the data reproducing apparatus according to this invention is characterized in that syncs are allocated every data of a predetermined length including the two systems of error correction codes, and write operation of data into the memory, correction of error using the two systems of error correction codes of data written into the memory, and read-out operation for decoding are carried out within reproduction period of the sync.

Furthermore, the data reproducing apparatus according to this invention is characterized in that the two systems of error correction codes are product code.

Moreover, this invention is directed to a data reproducing apparatus for reproducing recording data recorded on a disc, characterized in that the apparatus comprises: reproducing means for reproducing the recording data from the disc on which the recording data including a first error correction code added to data which has been caused to undergo interleaving processing and a second error correction code added to data which is not caused to undergo interleaving processing are recorded; and error correcting means for carrying out error correction with respect to the reproduced data by using only the second error correction code at the time of special reproduction.

Further, this invention is directed to a data reproducing apparatus for recording data recorded on a disc, characterized. in that the apparatus comprises: reproducing means for reproducing the recording data from the disc on which the recording data including two systems of error correction codes calculated so as to include sector header are recorded; error correcting means for carrying out error correction by using only one system of the two systems of error correction codes with respect to the reproduced data; and sector detecting means for detecting sector address from sector header of the error corrected data.

The data reproducing apparatus according to this invention is characterized in that the apparatus includes means for setting valid time period and invalid time period on the basis of continuity of valid sector address within the detected sector address, whereby in the case where the valid sector address is not detected within the valid time period, the above said means interpolates the sector address.

Further, this invention is directed to a data reproducing apparatus adapted for reproducing recording data recorded on a disc, characterized in that the apparatus comprises: reproducing means for reproducing the recording data from the disc on which the recording data including a first error correction code added to data which have been caused to undergo interleaving processing and a second error correction code added to data which is not caused to undergo interleaving processing are recorded; a DRAM into which the reproduced data is written so that the first error correction code and the second error correction code have directions perpendicular to each other; error correcting means for carrying out error correction with respect to data stored in the DRAM by the first error correction code and the second error correction code at least by using data which has been read out from the DRAM; and decoding means for decoding data which has been read out from the DRAM.

BRIEF DESCRIPTION OF THE DRAWINGS

FIGS. 12(a)–12(f) is a view for explaining the operation of flag register 73 of FIG. 4.

FIGS. 18(a–b) is a view for explaining sector address when write operation into ring buffer memory 5 is restarted.

BEST MODE FOR CARRY OUT THE INVENTION

Preferred embodiments of this invention will now be described with reference to the attached drawings.

Figure 4:
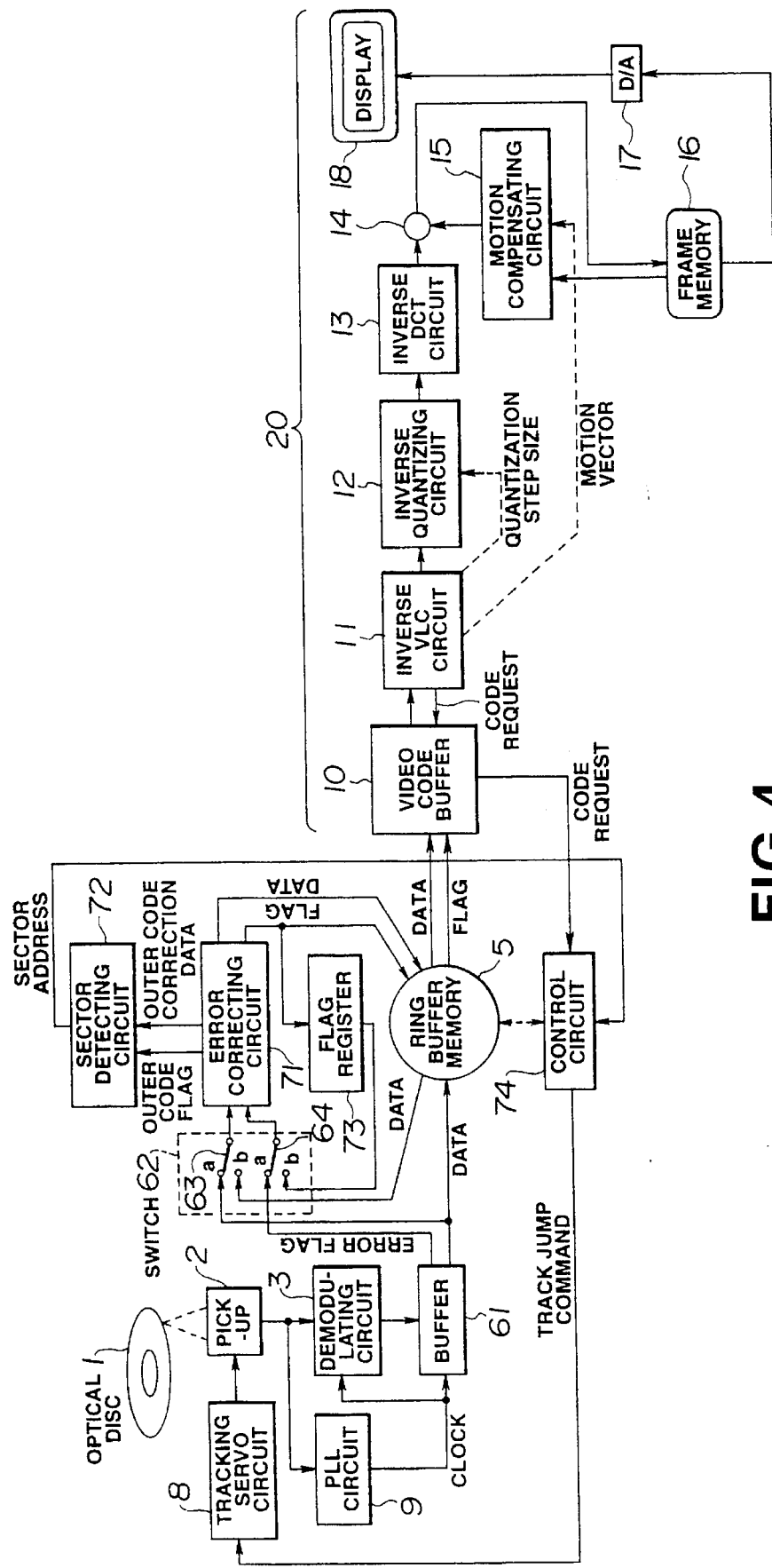
FIG. 4 is a block diagram showing the configuration of an embodiment of an optical disc apparatus to which a data reproducing apparatus of this invention is applied.

FIG. 4 is a block diagram showing an embodiment of an optical disc apparatus to which a data reproducing method of this invention is applied. In the figure, the same reference numerals are respectively attached to portions corresponding to the case in FIG. 1.

This optical disc apparatus will now be described. Prior thereto, data format in optical disc 1 reproduced in the optical disc apparatus will be described with reference to FIG. 5.

Figure 5:
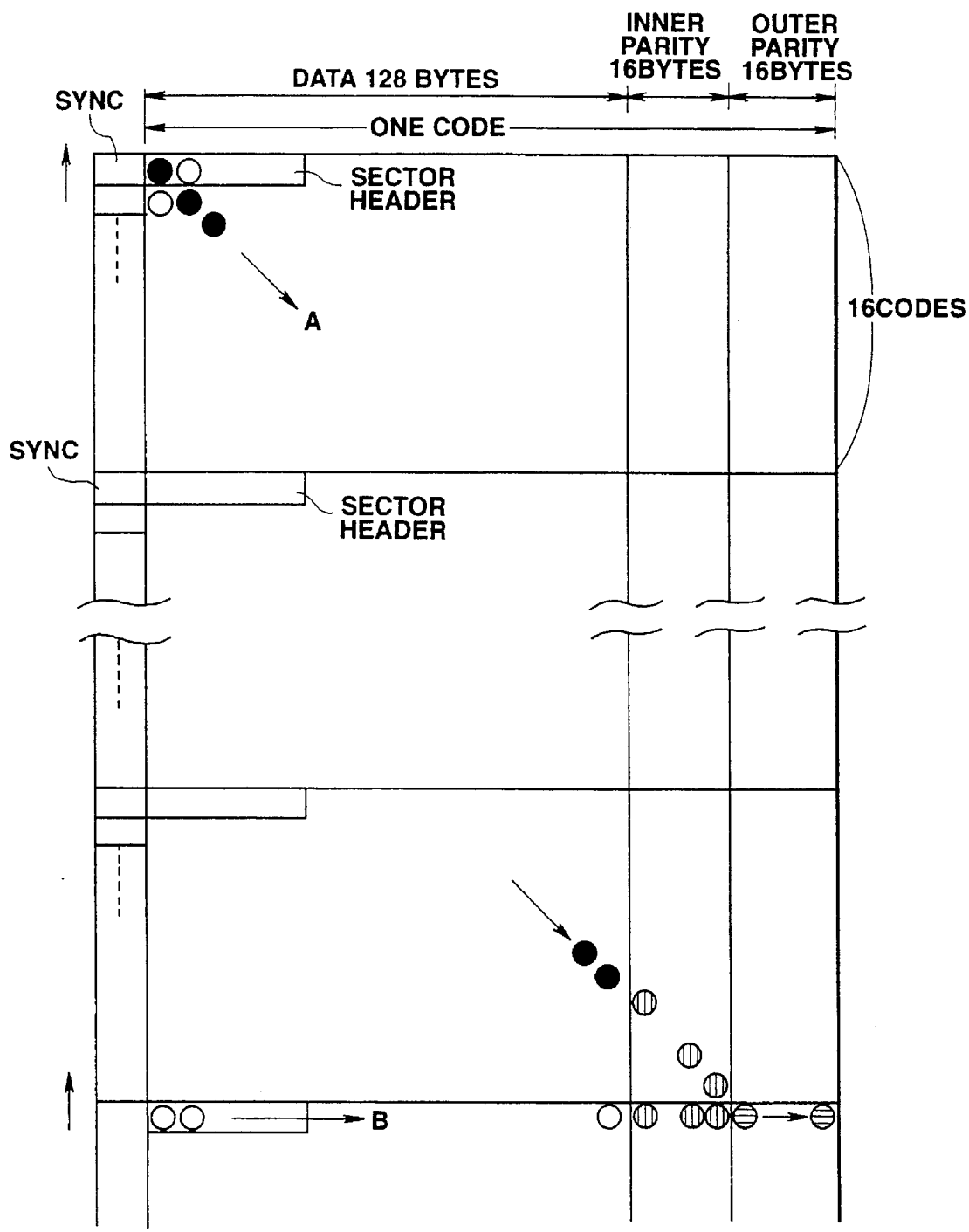
FIG. 5 is a view showing format of data of the data reproducing apparatus of this invention.

In FIG. 5, circular mark indicates data of one symbol (1 byte). Data is such that, e.g., one code (one row (line)) is constructed with 128 bytes being as a unit and includes sector headers every 16 codes.

Figure 6:
FIG. 6 is a view showing the configuration of sector header of the data format of FIG. 5.

Sector header consists of, as shown in FIG. 6, sector mark indicating that corresponding portion is sector header, sector address incrementing by one every sector, and CRC (Cyclic Redundancy Code) for error detection of sector header.

As shown in FIG. 5, with respect to data arranged so that one line (row) is comprised of 128 bytes, error correction code of 16 bytes is added as inner parity to data which has been read in an oblique direction (in a direction indicated by arrow A). In the figure, circular mark represented by adding longitudinal lines therewithin indicates inner parity. With respect to the inner parity, so called convolution is carried out and parity values are calculated without interruption from the leading portion to the last portion of the data in oblique direction. The code of 144(=128+16) bytes in oblique direction is called inner code.

Then, with respect to the row (line) in which calculation of inner parity has been completed, data is read in lateral direction (direction indicated by arrow B), and error code of 16 bytes is added as outer parity with respect to 144 bytes in total of data 128 bytes and inner parity 16 bytes. In FIG. 5, circular mark to which lateral lines are added indicates outer parity. Code of 160(=128+16+16) bytes in lateral direction is called outer code.

These two systems (kinds) of parity, i.e., inner parity and outer parity are calculated so as to include sector header, and it is thus possible to correct error which has occurred at the sector header portion by outer code correction or inner code correction.

To the leading portion of data of 160 bytes (data is 128 bytes, and inner parity and outer parity are 32 bytes) of each row (line), sync (synchronizing) signals are added as shown in FIG. 5.

Figure 7:
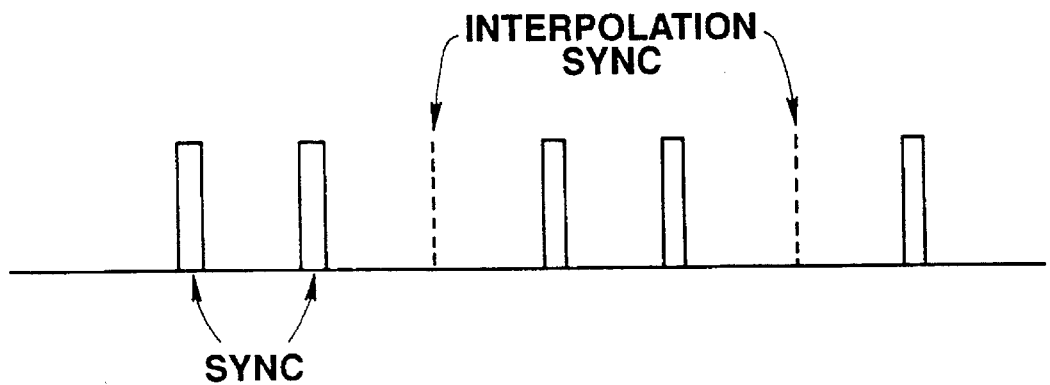
FIG. 7 is a view showing the state where sync are generated interpolation at demodulating circuit 3 of FIG. 4.

Pick-up 2 of FIG. 4 irradiates laser beams onto optical disc 1 on which picture data are recorded by a format as described above to reproduce, e.g., picture data recorded on the optical disc 1 from its reflected light. Data that the pick-up 2 outputs is inputted to demodulating circuit 3, at which it is demodulated. Moreover, output of pick-up 2 is inputted also to PLL circuit 9, at which clock is extracted. This clock is sent to demodulating circuit 3 and buffer memory 61. The data demodulated by the demodulating circuit 3 is inputted to buffer memory 61. Data which has been outputted from the buffer memory 61 is written into ring buffer memory 5 under control of control circuit Demodulating circuit 3 has sync protection function. Namely, in the normal reproduction state of disc, syncs are equidistantly obtained at leading portions of respective codes by reproduction data. In the case where sync fails to be obtained, interpolation of sync is carried out as shown in FIG. 7. Namely, since syncs are generated every predetermined period, in the case where sync is not detected at that period, sync is generated in a pseudo manner to output it. Since circuits succeeding to demodulating circuit 3 have sync as one operation unit, stable operation can be made by such sync interpolation.

Moreover, demodulating circuit 3 includes therein conversion table and collates input data with the conversion table every modulation unit thus to carry out demodulation.

In the case where combination of data which do not exist in the conversion table or inhibited combination of data is found out, the demodulating circuit 3 raises (sets) error flag every that symbol, i.e., sets flag to 1. Moreover, the demodulating circuit 3 recognizes lock state of PLL from clock delivered from PLL circuit 9 to raise (set) error flag for a time period during which lock is off.

Further, in the case where sync is generated by interpolation, and in the case where error flag in one code is greater than a predetermined setting number, error flags are raised (set) with respect to all symbols of one code length. Such error flags is or are sent to buffer memory 61 along with data.

Write and read operations of data with respect to ring buffer memory 5. and flag register 73 will now be described.

As ring buffer memory 5, SRAM (Static Random Access Memory) or DRAM (Dynamic Random Access Memory) may be employed. SRAM can continuously write or read data at a high speed without limitation unlike DRAM, but is expensive.

On the contrary, although DRAM is inexpensive, it is necessary to use so called high speed page mode in order to write or read data at a high speed. Page unit of high speed page mode is limited to, e.g., 258 bytes. In the case where data is read or written in a manner to exceed such a limitation, it is necessary to carry out page change (switching). According as the number of page change operations is smaller, processing time becomes shorter. In view of the above, in this apparatus, with respect to the case where outer code correction in the direction indicated by B of FIG. 5 is carried out and the case where inner code correction in the direction indicated by arrow A of FIG. 5, it is necessary to read or write data in different directions. In this instance, a method of storing data into ring buffer memory 5 is devised so that page change is carried out as equidistantly as possible and the number of times thereof is minimized also in either case.

The method of storing data into the ring buffer memory 5 will now be described. Namely, it is now assumed that data on the format shown in FIG. 5 is represented by matrix D(i, j) where i is code No. (row of FIG. 5) and j is No. of symbol within code when counted from the sync leading portion. When such a notation is employed, the i-th code (code of the i-th row) is comprised of 160 symbols of D(i, 0) to D(i, 159). Data train in the inner code direction of arrow A of FIG. 5 is expressed as follows.

$$D(i, 0), \quad D(i+1, 1), \quad D(i+2, 2),$$
$$\ldots, \quad D(i+143, 143)$$

On the other hand, address of ring buffer memory 5 is expressed as R(m, n) where m is row address and n is column address. n is a value in a range from 0 to 159. Row address and column address are defined with 16 being as page unit, respectively. Data (i. j) on the format of FIG. 5 is written into address R(m, n) that m and n, which is obtained by the following formula, indicate with respect to ring buffer memory 5. Namely, k is defined as follows.

$$k = (15 - (i \bmod 16)) + j$$
If $m = i$,
when $k < 160$, $n$ is equal to $k$, and
when $k \geq 160$, $n$ is equal to $k - 160$.

In the above expression, operator mod indicates remainder.

Figure 8:
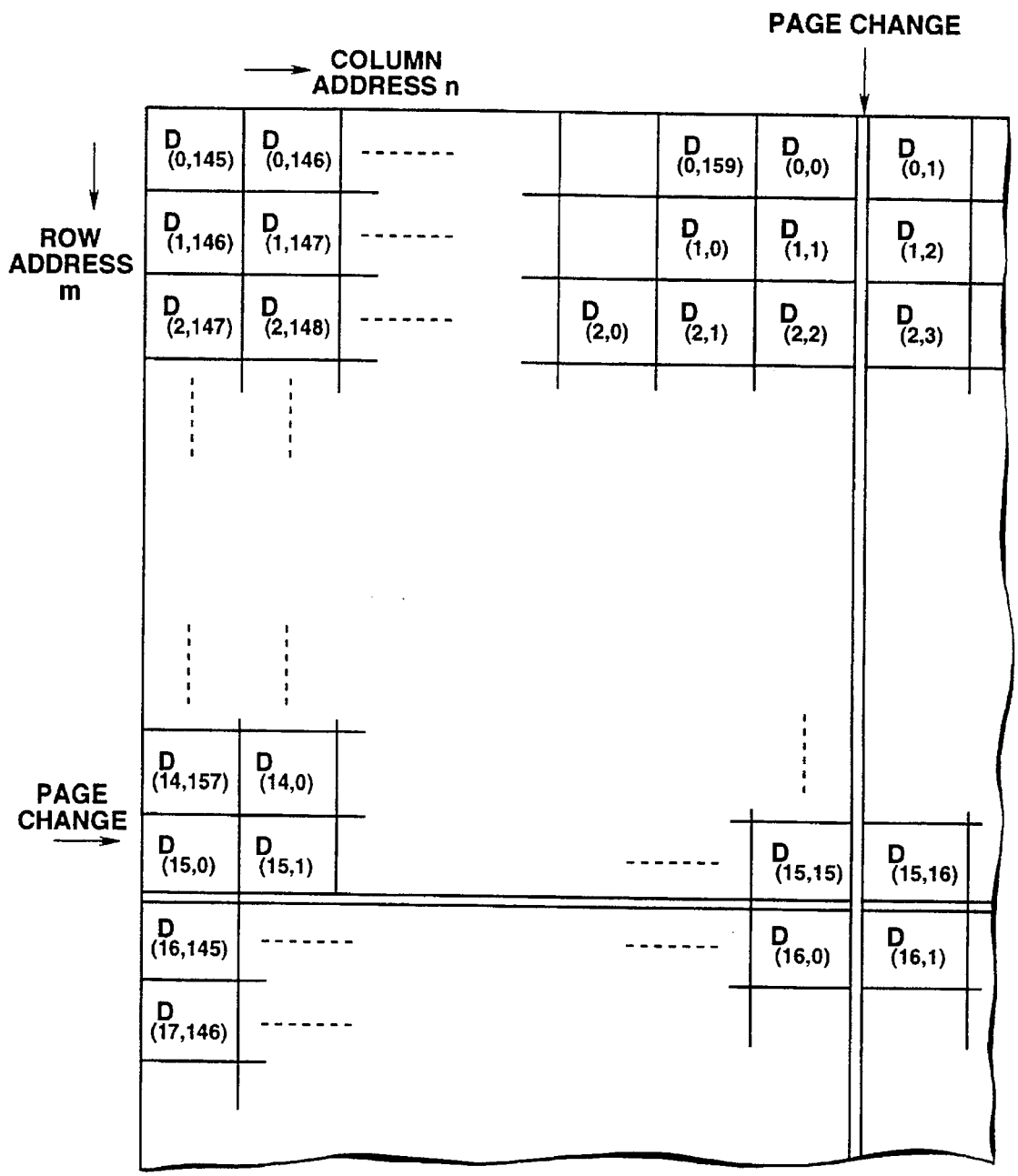
FIG. 8 is a view showing the state where data is stored into the ring buffer memory 5 of FIG. 4.
Figure 9:
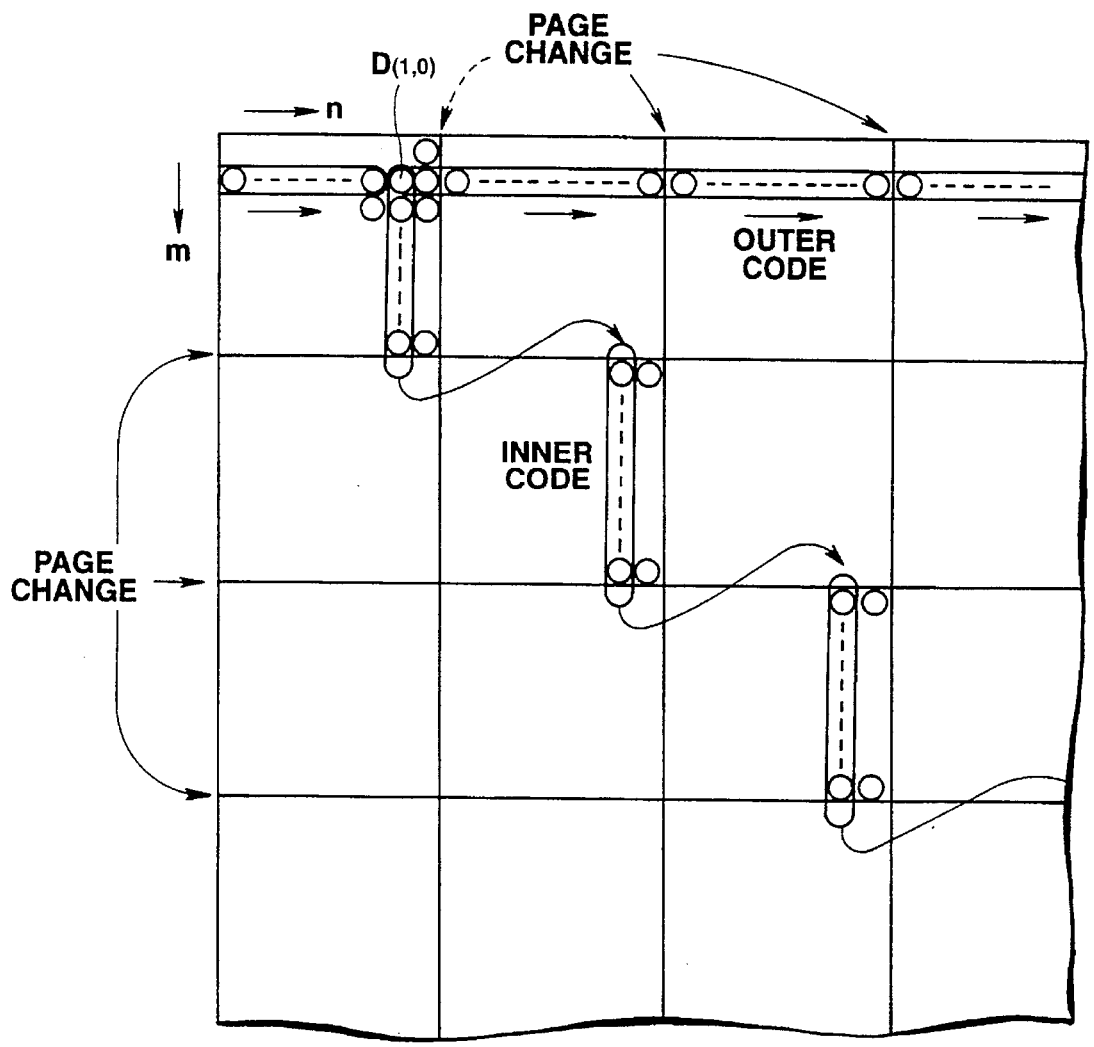
FIG. 9 is a view showing sequence for writing or reading data into/from the ring buffer memory 5 of FIG. 4.

The state where data D(i, j) is stored into address R(m, n) of ring buffer memory 5 is shown in FIG. 8. Moreover, in this case, data orders of outer code and inner code with D(1, 0) being as the leading data are as shown in FIG. 9. As apparent from FIG. 9, since outer codes are arranged in horizontal direction and inner codes are arranged in vertical direction, page changes equidistantly take place every 16 symbols except for the first several symbols also in either case. Accordingly, by storing data into ring buffer memory 5 in this way, high speed read/write operation can be realized by high speed page mode with respect to both the outer code and the inner code.

Figure 10:
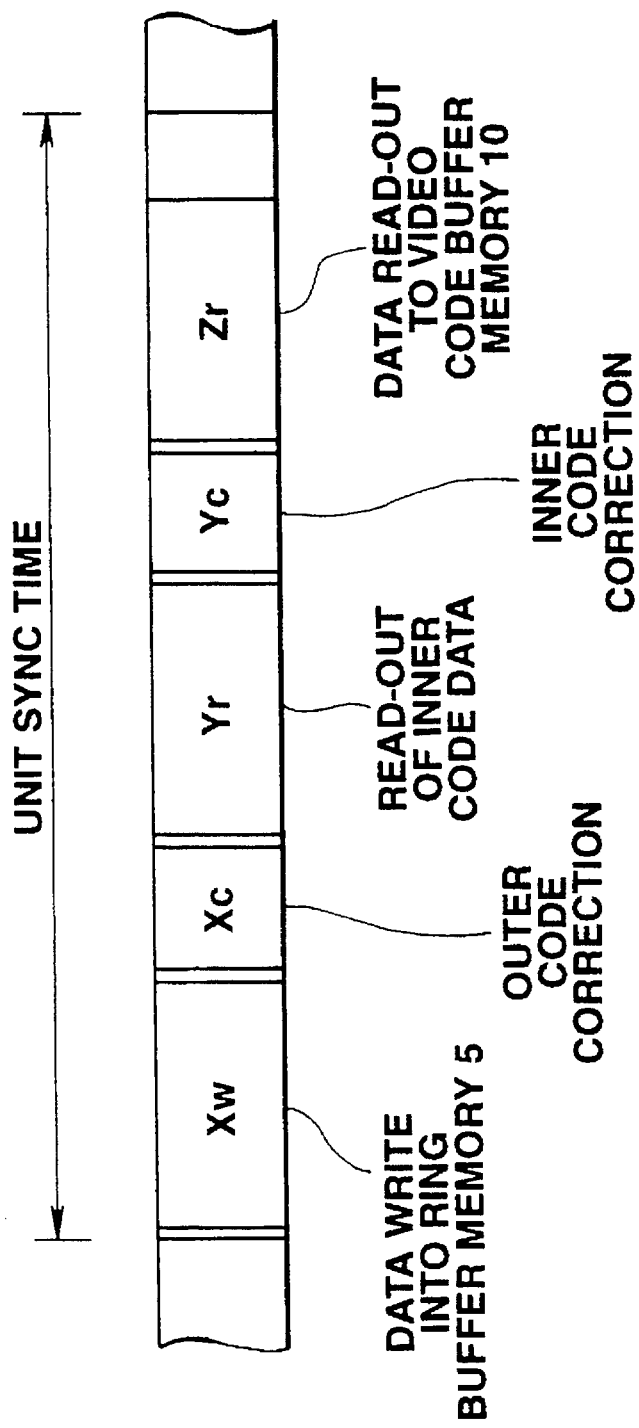
FIG. 10 is a view showing timing for writing or reading data into/from the ring buffer memory 5 of FIG. 4.

Write and read operations with respect to ring buffer memory 5 are carried out at a rate several times, e.g., five times greater than data rate inputted from demodulating circuit 3 to buffer memory 61. Its timing is shown in FIG. 10. One sync time of FIG. 10 is the same time as interval between syncs shown in FIG. 7, and corresponds to time required until data of one code of 160 bytes is inputted from demodulating circuit 3 to buffer memory 61.

Xw of FIG. 10 indicates write time period required when data of one sync temporarily stored in buffer memory 61 is written into ring buffer memory 5. Xc indicates rewrite time period of error symbol and outer code flag. Yr indicates read-out time period of inner code data on the ring buffer memory 5. Yc indicates rewrite time period of error symbol and inner code flag. Zr indicates read-out time period to video code buffer memory 10 of data on the ring buffer memory 5.

Figure 11:
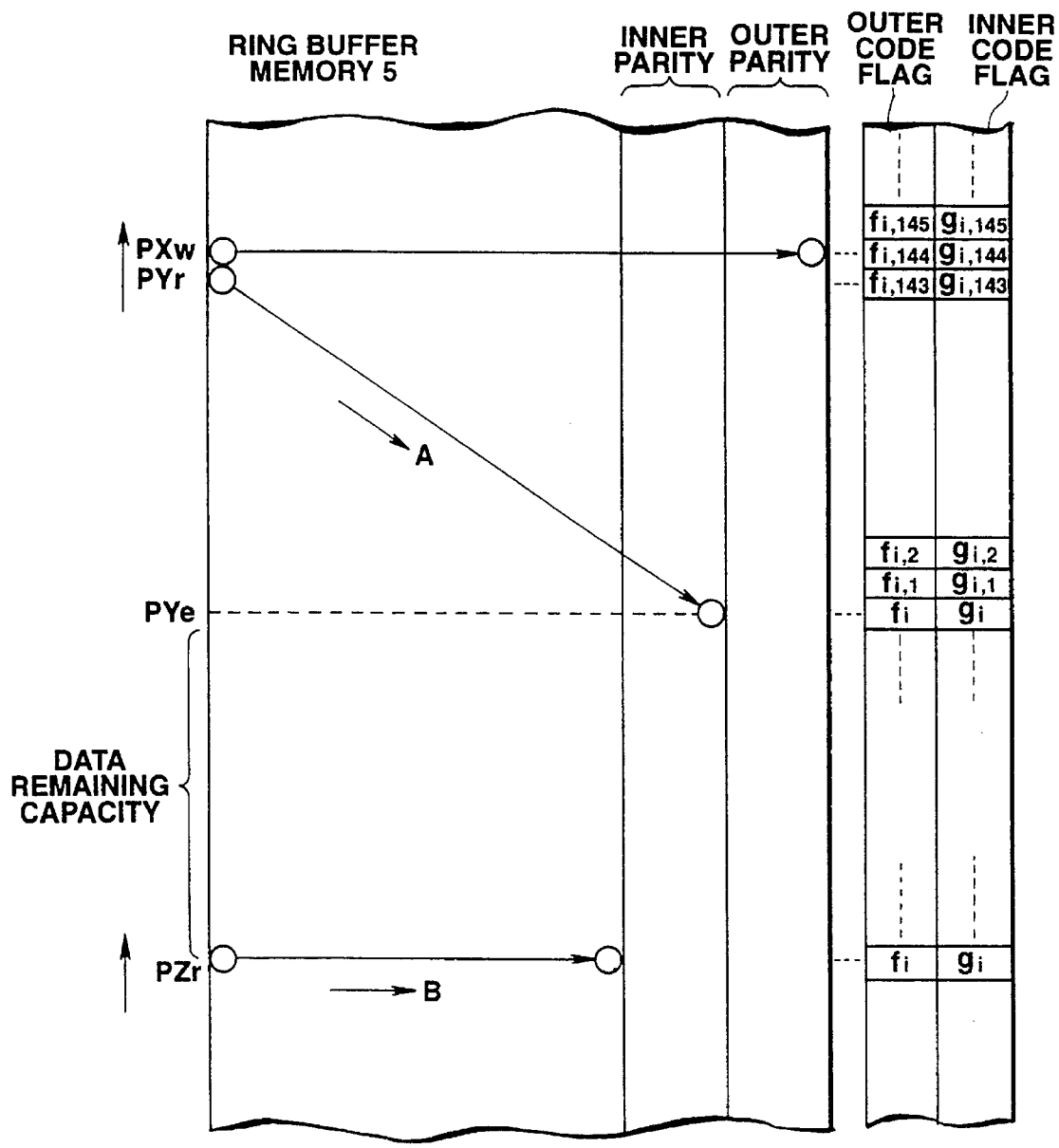
FIG. 11 is a view showing outline of memory space of the ring buffer memory 5 of FIG. 4.

FIG. 11 shows, in a model form, memory space of ring buffer memory 5 with one code length being set to one row (line) in lateral direction. In practice, data are stored as shown in FIGS. 8 and 9 into the DRAM. Write pointer of Xw is indicated by PXw. Respective pointers are assumed to move toward upper direction in the figure.

In the ring buffer memory 5, areas for storing flags of correction results of outer code correction and inner code correction are provided by 1 bit with respect to respective codes, and are shown at the right end of FIG. 11 in a manner to become in correspondence with the data area. An example of the configuration of flag register 73 is shown in FIGS. 12 and 13. In the case of the embodiment, data inputted through switch 81 is outputted through 144 stages of continuous registers and further through switch 82. Moreover, outputted data is fed back to the 144 continuous registers for a second time through one (stage of) register and switch 81.

Figure 13A:
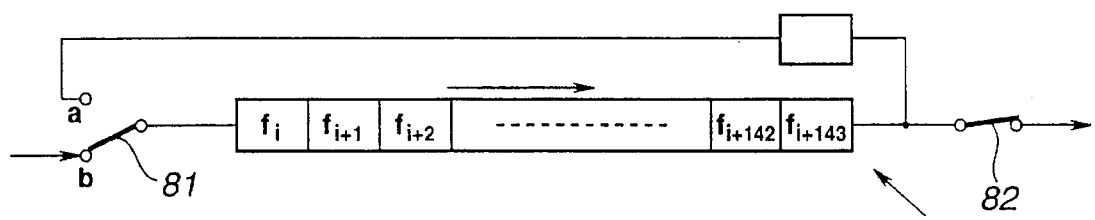
FIGS. 13(a)–13(c) is a view for explaining the operation of the flag register 73 of FIG. 4.

It is now assumed that error correction is progressing and there results the state where outer code correction with respect to row of PYr shown in FIG. 11 and inner code correction in a direction indicated by arrow A of FIG. 11 including symbol below PYr by one are completed. At this time, there results the state where past outer code flags fi+143, fi+142, . . . fi are stored in 144 registers of flag register 73 as shown in FIG. 13(a). The process from the state where flag register 73 is vacant, i.e., error correction is initially started until there results the state as described above will be described later. The operation from error correction until data is sent to video code buffer will be described below with reference to the timing chart of FIG. 10.

Figure 2:
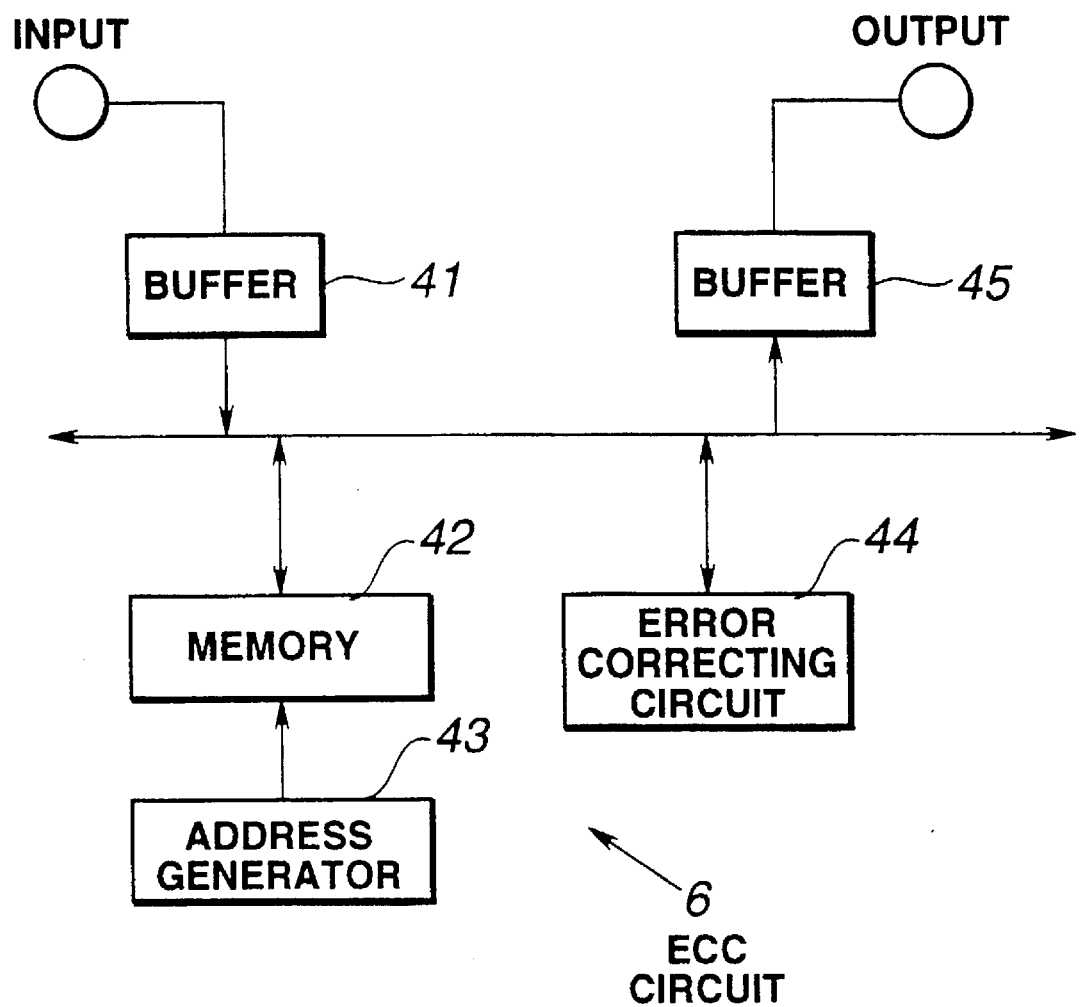
FIG. 2 is a block diagram showing more detailed configuration of ECC circuit 6 of the optical disc apparatus of FIG. 1.
Figure 3:
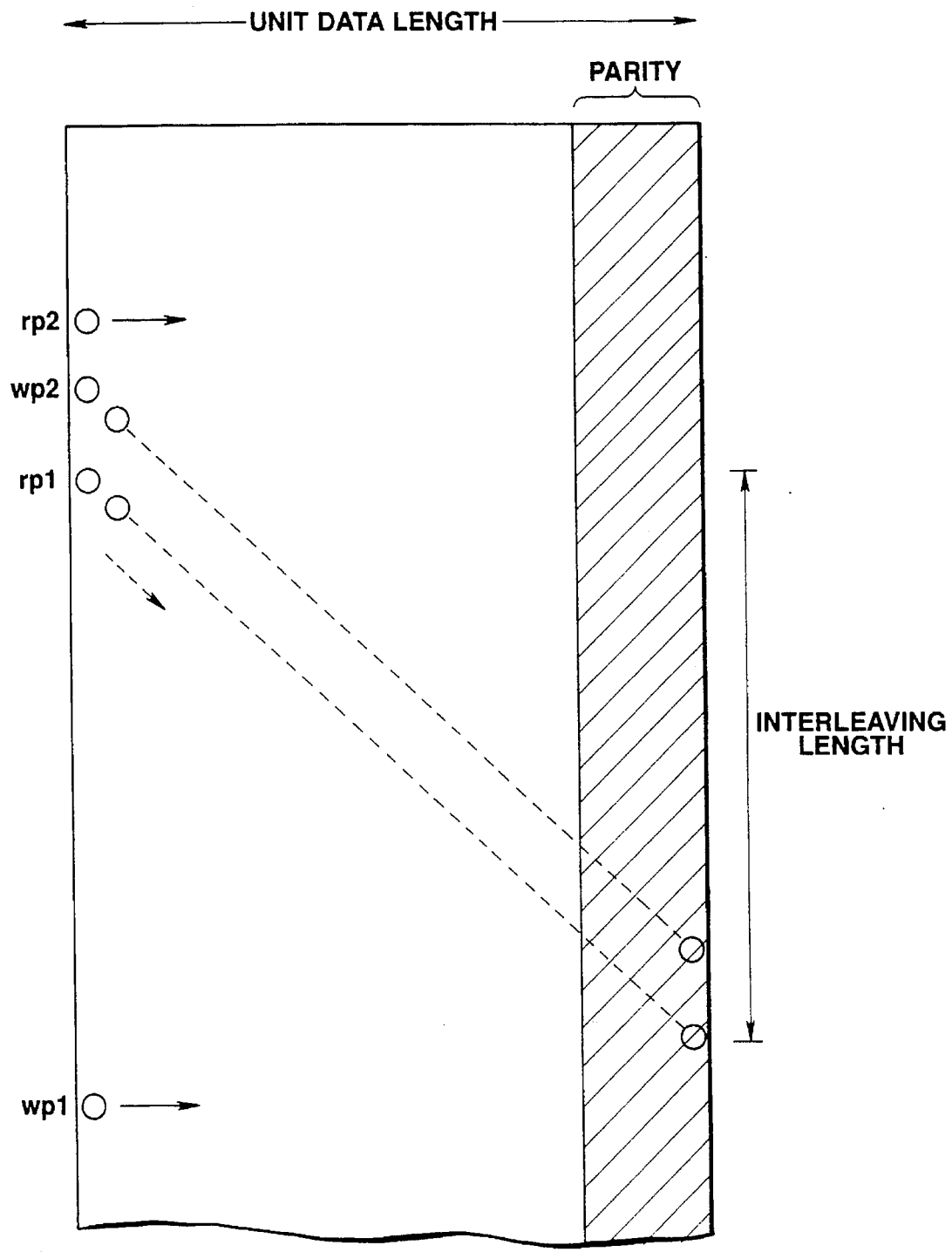
FIG. 3 is a memory map showing memory space of memory 42 of the ECC circuit 6 of FIG. 2.

At time period Xw of FIG. 10, when data of one row that pointer PXw of FIG. 11 indicates, which is stored in buffer memory 61, is written into ring buffer memory 5, interlocking selector contacts 83, 84 of switch 82 are both connected to contact a side. At the same time when data outputted from buffer memory 61 is written into ring buffer memory 5, it is inputted to error correcting circuit 71 corresponding to the error correcting circuit 44 of FIG. 2 through selector contact 63 or 64 of switch 62 along with error flag similarly outputted from buffer memory 61 at the same timing. This error correcting circuit 71 carries out eraser correction of inputted data that pointer PXw of FIG. 11 indicates by using outer parity and error flag. As the result of correction, error symbol and its correction value are obtained. Then, at time period Xc of FIG. 10, error correcting circuit 71 delivers corrected value to ring buffer memory 5 and flag register 73. At ring buffer memory 5, overwrite operation of corrected value is carried out with respect to corresponding error symbol. Moreover, since correction is carried out, outer code flag (outer code flag fi+144 in this case) of FIG. 11 is caused to be zero. If the number of errors is great and correction is impossible, rewrite operation of data on the ring buffer memory 5 is not carried out to judge this state to be correction inability state, thus to write 1 into outer code flag fi+144.

Then, at the time period Yr of FIG. 10, selector contacts 63, 64 of switch 62 are switched to contact b, and data is read out, for inner code correction, from the ring buffer memory 5 in the interleaving direction from the position indicated by pointer PYr, i.e., the direction indicated by arrow A of FIG. 11 or the vertical direction of FIG. 9. The data thus read out is inputted to error correcting circuit 71. On the other hand, outer code flags fi+143, fi+142, . . . fi are read out in order from flag register 73, and are used for correction of inner code. The error correcting circuit 71 carries out eraser correction of input data (inner code) by using outer code flag and inner parity inputted thereto.

Figure 13B:
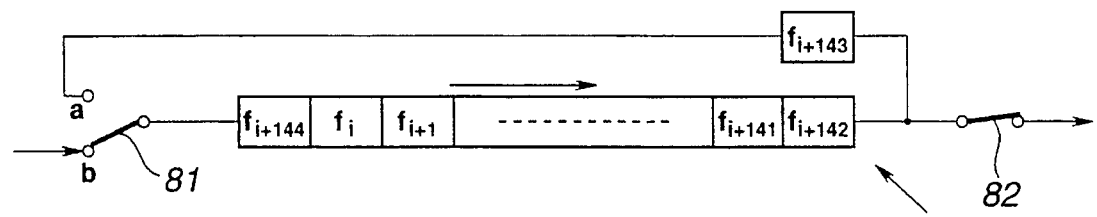

At this time, flag register 73 operates as follows. As shown in FIG. 13(b), outer code flag fi+144 outputted from error correcting circuit 71 is stored into the leftmost register of flag register 73 through contact b of switch 81. At the same time, outer code flag fi+143 stored at the rightmost register of flag register 73 is outputted through switch 82.

Figure 13C:
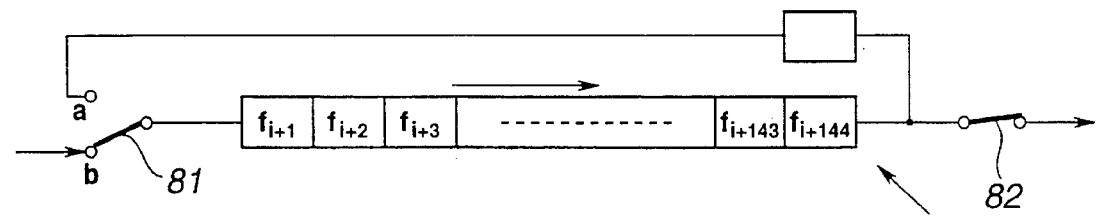

Then, as shown in FIG. 13(c), switch 81 is switched to contact a side, and outer code flag fi+144 is transferred up to the rightmost register of shift register of 144 stages. At the same time, fi+142, . . . fi stored in respective registers are outputted through switch 82. In a manner as stated above, flag register 73 can output outer code flags fi+143, fi+142, . . . . fi corresponding to one inner code length. Moreover, outer coder flags fi+144, fi+143, fi+142, . . . fi+1 are stored into 144 registers of flag register 73. In a manner as stated above, flag register 73 always stores latest outer code flags by one inner code length (144).

The reason why although outer code flag is written into vacant area of ring buffer memory 5, it is stored into flag register 73 and is delivered to error correcting circuit 71 is that it is impossible to read out, at the same time, data and outer code flag every symbols from different areas within the ring buffer memory 5.

Then, at time period Yc of FIG. 10, similarly to the case of correction of outer code, corrected value is sent into ring buffer memory 5 with respect to error symbol on the ring buffer memory 5 and is overwritten thereonto. If the number of errors is great to such an extent that correction is impossible, rewrite operation of data is not carried out.

Moreover, with respect to inner code flags gi to gi+143, if errors are corrected, zero (0) is written into vacant area of ring buffer memory 5, while if error is unable to be corrected, 1 is written into empty area of ring buffer memory 5. It is to be noted that, with respect to inner code flags where 1 is already written in the past inner code correction among inner code flags gi to gi+143, no data is written.

Figure 14:
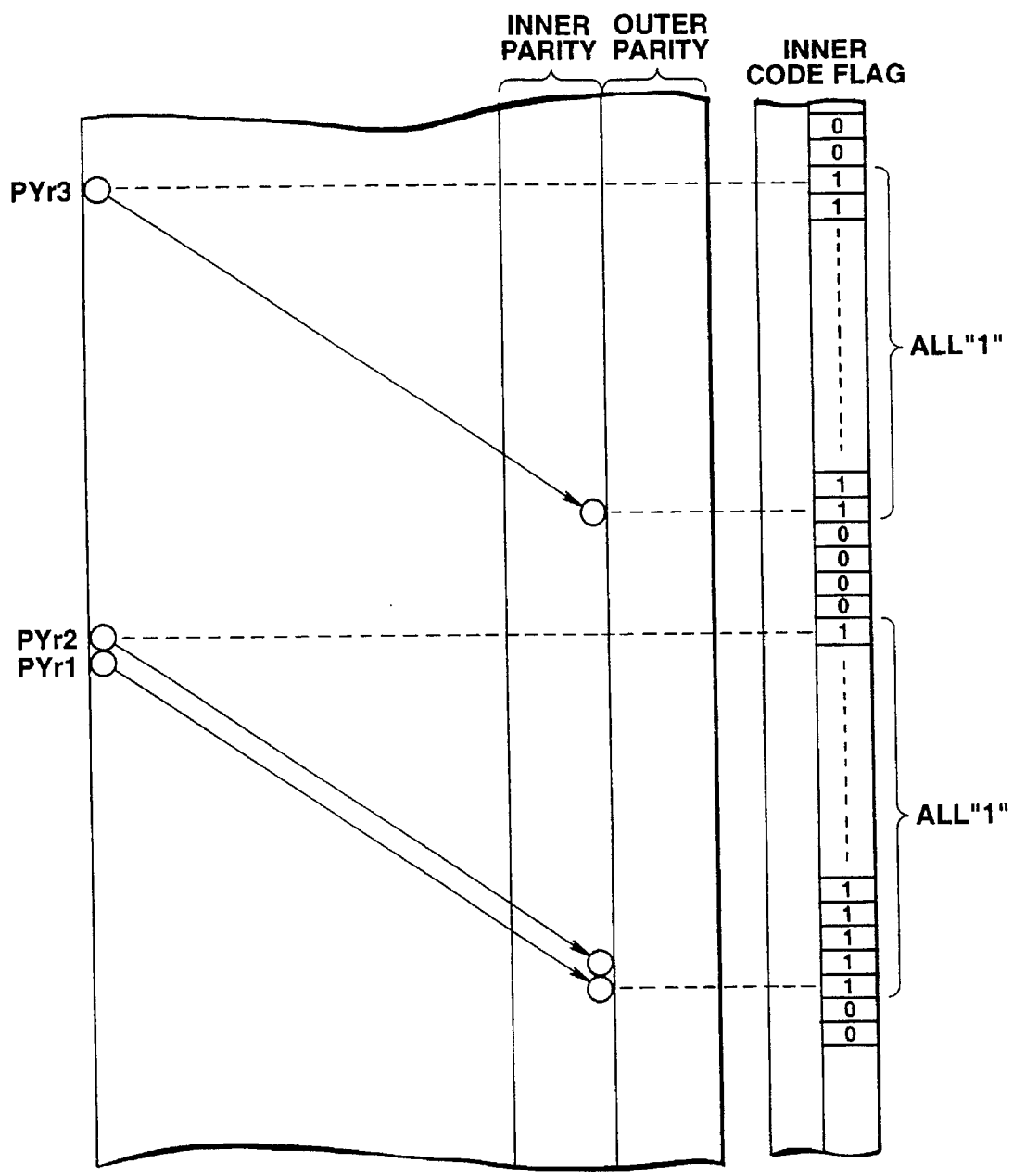
FIG. 14 is a view for explaining inner code flag written into ring buffer memory 5.

This operation will now be described with reference to FIG. 14. Assuming that only three inner codes that pointers of PYr1, PYr2, PYr3 indicate were unable to be corrected in FIG. 11, inner code flag is written as shown in FIG. 14. Namely, flag indicating the range where uncorrectable inner codes exist when viewed from outer code direction is inner code flag.

Data on the ring buffer memory 5 in which error correction has been completed in this way is eventually read out to video code buffer memory 10 of decode section 20 at the time period Zr of FIG. 10. PZr of FIG. 11 is read pointer in this case. Data are read in forward direction (in horizontal direction). Since error correction has been already completed and inner parity and outer parity are therefore unnecessary, they are read in a skipped manner. Moreover, as shown in FIG. 11, logical product of outer code flag fj and inner code flag gj through AND gate (not shown) with respect to PZr is sent to video code buffer memory 10 as correction inability flag of code of the j-th row.

A series of operations as described above are repeated in accordance with the time chart of FIG. 10. Thus, data which has been already caused to undergo outer code correction and inner code correction by error correcting circuit 71 is delivered to video code buffer 10 through ring buffer memory 5.

The reason why logical product of fj and gj is obtained is that if, e.g., a certain inner code is unable to be corrected, inner code flag would be raised (set) over the length of inner code length in oblique direction, i.e., in the interleaving direction, so correction inability portion cannot be specified. If logical product of outer code flag fj and inner code flag gj is provided, even when inner code flag is raised (set), in the case where outer code flag can be corrected, it can be judged that there is no error in that row j, thus making it possible to more precisely raise (set) correction inability flag with respect to the correction inability error portion.

In this example, as shown in FIG. 11, difference portion between pointers PYe and PZr becomes data remaining quantity of ring buffer memory 5. In the figure, PYe indicates pointer of the latest data in which inner code correction has been completed.

Figure 1:
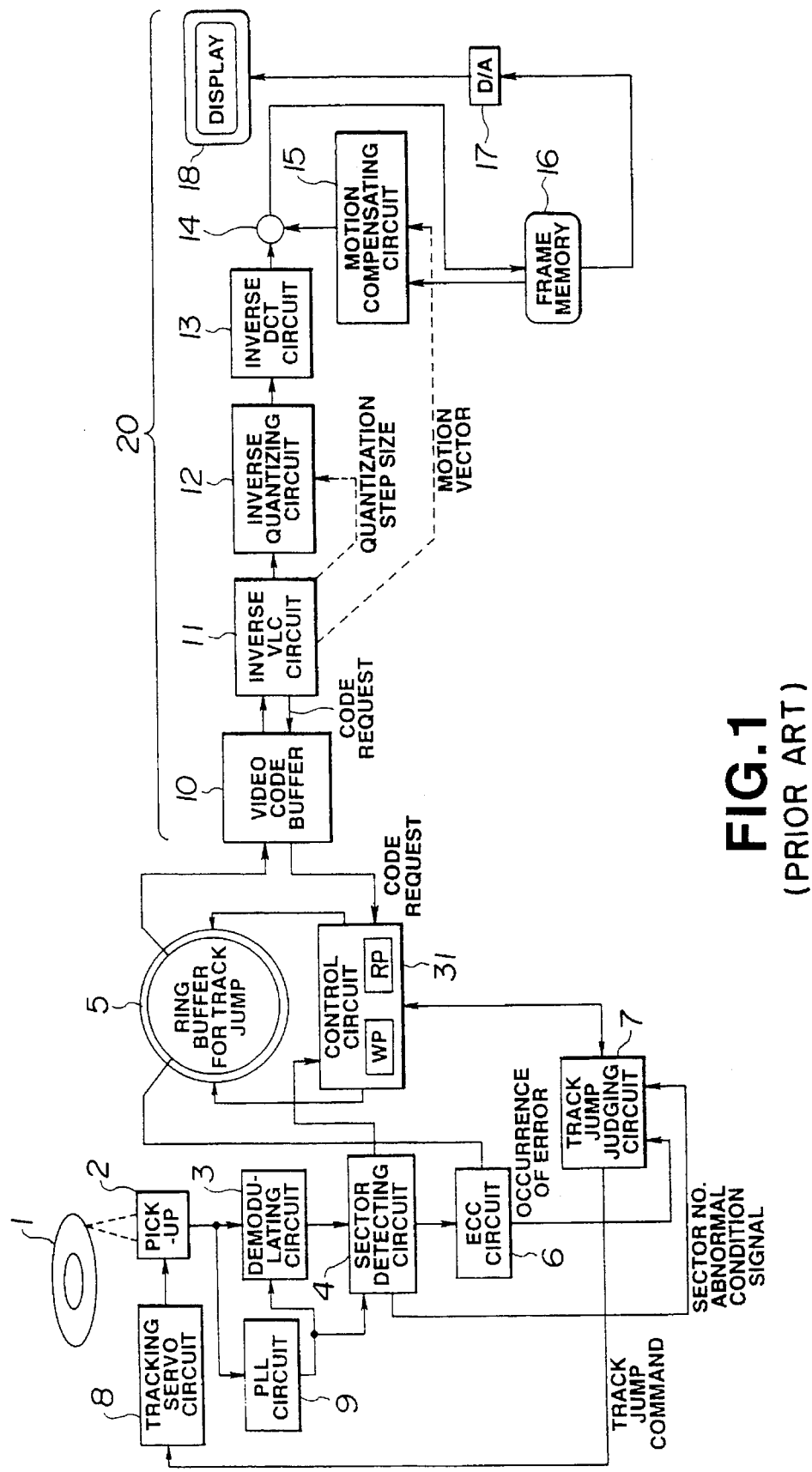
FIG. 1 is a block diagram showing the configuration of an example of a conventional optical disc apparatus.

If correction inability flag is zero, i.e., correction is correctly carried out, data sent from ring buffer memory 5 to video code buffer memory 10 is decoded at decode section 20 similarly to the case in FIG. 1. If correction inability flag is 1, since that code includes any error, the moving picture decoding circuit of the succeeding stages, i.e., inverse VLC circuit 11 to motion compensating circuit 15 stop decode operation until that flag becomes equal to zero, and repeatedly send already decoded picture data stored in frame memory 16 to display 18 to thereby allow them to be still picture, thus preventing disturbance of picture.

In this example, the operation of flag register 73 from the state where flag register 73 is vacant until there results the state of FIG. 13(a) is indicated.

It is now assumed that pointer PXw is located at position of outer code flag fi (position of PYe) in FIG. 11, and error correction is started for the first time from this position. When outer code correction of row of this PYe is completed, switch 81 is switched to contact b side as shown in FIG. 12(a), and outer code flag fi that error correcting circuit 71 outputs is inputted to the left most register of shift register of continuous 144 stages. The outer code flag fi of the leftmost register is shifted in right direction in succession through 144 stages of shift register, and is transferred to the rightmost register.

Then, pointer PXw is moved to the position above by one row, i.e., the position above by one row of PYe in FIG. 11. Then, outer code correction of code of that row is carried out. Thus, as shown in FIG. 12(b), outer code flag fi+1 is inputted to the leftmost register of shift register comprised of continuous 144 stages. At this time, outer code flag fi of the rightmost register of the shift register comprised of continuous 144 stages is transferred to single stage of register.

Further, as shown in FIG. 12(c), switch 81 is switched to contact a side, and outer code flag fi+1 is shifted in right direction in succession through 144 stages of shift register. Eventually, that flag is transferred up to the rightmost register. At this time, since switch 81 is switched to contact a side, outer code flag fi is inputted to the leftmost register of 144 stages of the shift register. This flag is shifted in right direction in succession, and is transferred up to register preceding by one with respect to the rightmost portion.

Then, pointer PXw is moved to the position above by further one row, i.e., above by two rows of PYe. Then, outer code correction of code of that row is carried out. As shown in FIG. 12(d), switch 81 is switched to contact b side. Thus, outer code flag fi+2 is inputted to the leftmost register of the shift register comprised of continuous 144 stages. At this time, outer code flag fi+1 of the rightmost register of the shift register comprised of continuous 144 stages is transferred to single stage of register. Moreover, outer code flag fi is transferred to the rightmost register of the shift register.

Further, as shown in FIG. 12(e), switch 81 is switched to contact a side, and outer code flag fi+2 is shifted in right direction in succession through 144 stages of the shift register and is transferred to the rightmost register. At this time, since switch 81 is switched to contact a side, outer code flag fi+1, fi are inputted in sequence to the leftmost register of the shift register of 144 stages. Further, these flags are shifted in right direction in succession, and are respectively transferred to registers preceding by two and preceding by three with respect to the rightmost register.

Then, as shown in FIG. 12(f), switch 81 is switched to contact b side. At times subsequent thereto, similar processing is repeated. Accordingly, outer code flags are inputted to flag register 73 at a rate of one to one sync. In the case of this example, for time periods from FIG. 12(a) to FIGS. 12(f) and FIG. 13, switch 82 is caused to be in open state. Therefore, no outer code flag is outputted.

As described above, at the time point when pointer PXw comes to the position shown in FIG. 11, there results the state where outer code flags fi+143, fi+142, . . . fi are stored into 144 registers of flag register 73 as shown in FIG. 13(a).

Meanwhile, when memory space of ring buffer memory 5 is assumed to be represented by circle as shown in FIG, 15, pointers PXw, PYr, PZr rotate in counterclockwise direction indicated by arrow in such a manner that they do not outrun each other. Distance between pointers PXw and PYr is fixed, and there is no possibility that they are apart from each other. Ring buffer memory 5 reads out data by request from video code buffer memory 10, and delivers it to video code buffer memory 10. In correspondence with this, data remaining quantity shown in the figure changes.

Read/write operation of data with respect to ring buffer memory 5 is under control of control circuit 74, and the above-mentioned pointers PXw, PYr, PZr are caused to undergo management by control circuit 74. Moreover, control circuit 74 also carries out write/read control with respect to flag register 73.

Then, extraction of sector address will now be described. As previously described, data outputted from buffer memory 61 is delivered to error correcting circuit 71 through switch 62, at which it is corrected. In this case, data which has been caused to undergo outer code correction is sent to sector detecting circuit 72 together with outer code flag. The sector detecting circuit 72 retrieves sector mark from inputted data to detect sector header. Then, this circuit 72 carries out error detection by CRC. Moreover, the sector detecting circuit 72 reads out sector address from sector header to store it.

With respect to sector address, in the case where error is not detected by error detection of CRC, or in the case where even if error is detected by error detection of CRC, outer code flag is zero, sector address at that time is sent to control circuit 74.

While extraction of sector address is carried out after outer code correction, since outer codes are arranged in the same direction as that of arrangement of data on the optical disc 1, sector address cannot tolerate burst error and error in such case is unable to be corrected, resulting in the possibility that no sector address may be obtained. Moreover, there is also the possibility that any erroneous correction may take place by outer coder correction. Accordingly, it cannot be said that correct sector address can be obtained every sector. In view of the above, whether or not sector address is correct is monitored by flywheel operation of control circuit 74, which will be described below.

The flywheel operation of sector address will now be described. Control circuit 74 monitors sector address inputted from sector detecting circuit 72, whereby when sector address can be detected by 16 code interval and value of sector address increments by one, the control circuit 74 judges that sector address to be valid. If valid sector addresses are continued by the number of sectors set in advance, e.g., 3 sectors or more, flywheel is assumed to be ON.

In the case where flywheel is ON, if the state where sector address is not valid is continued by the number of sectors set in advance, e.g., 5 sectors or more, flywheel is caused to be OFF. Such a state may take place in the case where pick-up 2 jumps to different track, e.g., by impact, etc. In this case, abnormal condition processing operation is carried out. This will be described later.

Figure 16:
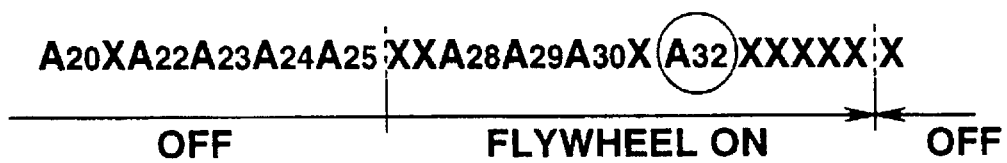
FIG. 16 is a view for explaining inputted sector address and ON/OFF of flywheel.

The state of flywheel is shown in FIG. 16. A indicates valid sector address and X indicates invalid sector address. Suffix of A indicates address value. It is now assumed that sector addresses are obtained from the left to the right. Since three sectors of A23, A24, A25 could be continuously obtained as valid sector address with A22 being as initial point, flywheel is turned ON. Moreover, since 5 sectors could not be continuously obtained as valid sector address, flywheel is turned OFF.

In the state where flywheel is ON, sector addresses are stored while updating them with valid sector address obtained last being as the latest valid sector address. In FIG. 16, A32 is the latest valid sector address.

The flywheel is allowed to be turned ON or OFF in this way to thereby monitor whether or not sector address is correctly obtained, whereby in the case where there is any error in data and sector address is not temporarily obtained, interpolation is implemented on the assumption that sector addresses are continuous from value immediately before, thereby making it possible to carry out stable write operation of data into ring buffer memory 5.

When reproduction of optical disc 1 is started, data outputted from buffer memory 61 is not immediately written into ring buffer memory 5. At control circuit 74, when sector addresses are continuously detected and flywheel is turned ON, pointers PXw, PYr are sent to ring buffer memory 5 for the first time. Thus, write and read operations of ring buffer memory 5, and error correction of inner code in the error correcting circuit 71 are started. It should be noted that correction of outer code is always carried out. This similarly applies to the case where write operation is restarted after it is interrupted. Write operation into ring buffer memory 5 is carried out under the state where flywheel is always ON.

Track jump of pick-up 2 will now be described. In the case where data remaining quantity of ring buffer memory 5 is above set value so that there is the possibility that overflow may take place, i.e., in the case where there is the possibility that pointer PXw outruns PZr in FIG. 15, track jump command is outputted from control circuit 74 to tracking servo circuit 8. At this time, write/read operation of ring buffer memory 5, and error correcting operation of inner code of error correcting circuit 71 are interrupted. Then, flywheel is turned OFF. Thus, the latest valid sector address, e.g., A32 in FIG. 16 is stored.

Figure 17:
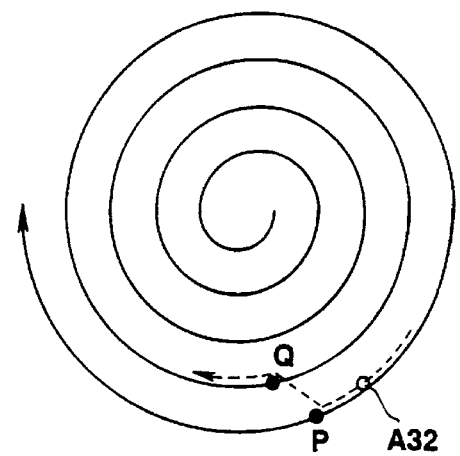
FIG. 17 is a view showing locus when pick-up 2 is caused to undergo track jump on optical disc 1.

FIG. 17 shows recording track of optical disc 1. In this figure, the latest valid sector address A32 is located precedently to the point where jump starts. When jump is instructed, position of pick-up 2, i.e., reproduction point jumps as shown from the point P to the point Q to start reading of the inner circumferential tracks. As a result, flywheel is turned ON for a second time. When optical disc 1 makes one round, and pick-up 2 comes up to the latest valid sector address A32 already stored, write and read operations of ring buffer memory 5, and error correction of inner code of error correcting circuit 71 are restarted from that point.

FIG. 18(a) shows the state where sector address is detected when pick-up 2 comes to the point P for a second time. Write operation of data from sector of A32 into ring buffer memory 5 is restarted.

At this time, there may be instances where A32 is invalid sector. FIG. 18(b) shows an example of such a case. In this case, since flywheel is turned ON, even if A32 is not detected, interpolation is carried out from past address. Then, write operation is restarted from data later by 16 codes of A31.

By carrying out the above-mentioned operation, it is possible to successively write continuous data into ring buffer memory 5 although write operation is interrupted by track jump.

Figure 15:
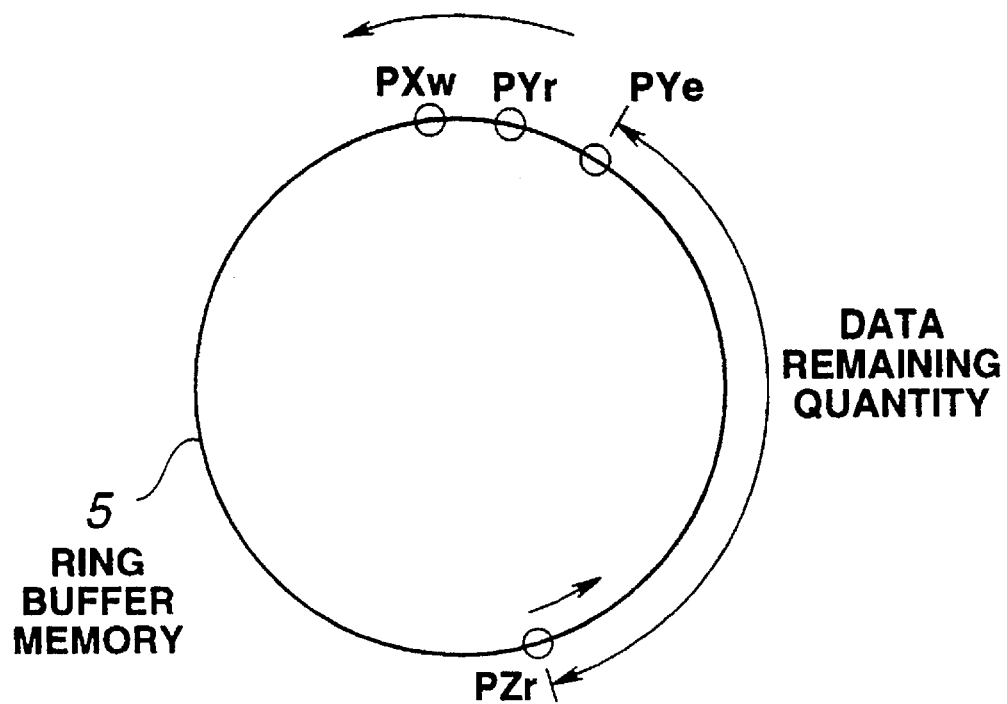
FIG. 15 is a view for explaining write and read pointers on the ring buffer memory 5 of FIG. 4.

Since pointers PXw, PYr (PYe) are stopped by track jump, but data are read out in accordance with request of video code buffer memory 10 for this time period, pointer PZr is advanced in counterclockwise direction in FIG. 15 and data remaining quantity of ring buffer memory 5 is decreased. Thus, overflow can be prevented.

Abnormal condition processing operation will now be described. It is now assumed that track jump that pick-up 2 does not intend takes place by disturbance, e.g., mechanical vibration, etc. At this time, since continuous sector addresses cannot be obtained, flywheel is turned OFF. Thus, write and read operations of ring buffer memory 5, and error correcting operation of inner code of error correcting circuit 71 are interrupted. Moreover, at this time, control circuit 74 allows pick-up 2 to be moved so as to read sector address preceding, e.g., by 20 sectors by making reference to the latest valid sector address. By making such an operation, flywheel is turned ON for a second time immediately before the latest valid sector address, thus making it possible to similarly restart write operation from the latest valid sector.

In this instance, if there is sufficiently margin in the data remaining quantity, there is no possibility that data remaining quantity of ring buffer memory 5 becomes equal to zero by the time when pick-up 2 returns to the position where track jump that it does not intend takes place, thus to restart data read-out operation. Accordingly, there is no possibility that read-out operations from ring buffer memory 5 to video code buffer memory 10 does not break. Thus, recovery can be made without affecting picture decode/reproduction by any means.

Figure 19:
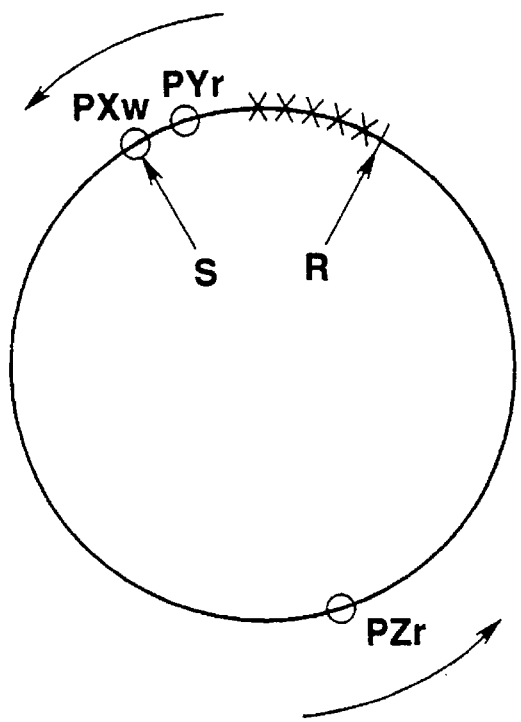
FIG. 19 is a view for explaining write and read pointers on the ring buffer memory 5 of FIG. 4.

The processing in the case where error correction inability takes place will now be described. FIG. 19 shows respective pointers on ring buffer memory 5 similarly to FIG. 15. It is now assumed that the portions indicated by the point X after the point R were assumed to be subjected to correction inability by outer code correction and inner code correction. Control circuit 74 stores in advance address of the leading sector of the correction inability portion. Then, in the case where error correction is judged to be possible in the control circuit 74, error correcting circuit 71 successively carries out re-correction up to the point S passed by fixed distance, e.g., 5 sectors from the end of error inability portion.

Initially, control circuit 74 calculates time obtained by adding the time required for one circumference of disc to the time required for carrying out error correction from the point R to the point S. Then, the control circuit 74 multiplies this time by the maximum speed of data transfer from ring buffer memory 5 to video code buffer memory 10 to determine the maximum quantity of data that the ring buffer memory 5 can lose within the time obtained by this multiplication. Further, this data quantity and the data remaining quantity on the ring buffer memory 5 are compared with each other. Since if the data remaining quantity is greater, there is no possibility that pointer PZr outruns PYr, it is judged that correction can be repeatedly carried out.

In this embodiment, there is employed an approach to determine, precisely to some degree, the time of one circumference of disc from position information in the disc radius direction of pick-up 2, whereby, particularly with respect to the disc inner circumference where the time of one circumference is short, even in the case where data remaining quantity is small, repetitive correctability can be enhanced (improved). Namely, in the case where pick-up 2 is positioned near the outermost circumference of disc 1, since one rotation period of disc is long, unless data remaining quantity corresponding thereto is left within ring buffer memory 5, the above-mentioned re-correction cannot be made. On the contrary, in the case where pick-up 2 is positioned at the inner circumferential side, rotation period is short. Therefore, even if data remaining quantity is small, re-correction can be made.

Figure 20:
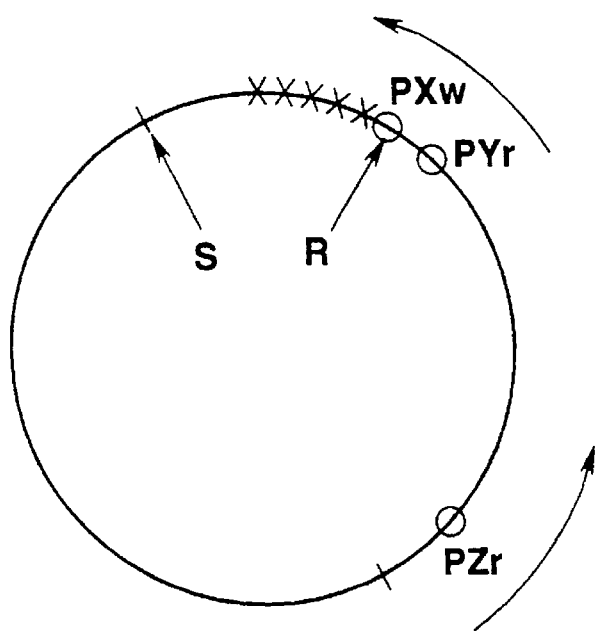
FIG. 20 is a view for explaining write and read pointers on the ring buffer memory 5 of FIG. 4.

In the case where it is judged that repetitive correction can be made, track jump is first carried out to stop read operation from optical disc 1 to switch selector contacts 63, 64 of switch 62 to contact b. Pointers PXw and PYr are returned to the point R as shown in FIG. 20, and outer code correction and inner code correction are started for a second time from that point. When correction up to the point S is completed, pointer is stopped thereat to switch contacts 63, 64 of switch 62 to contact a to restart write operation immediately after data of the point S and data subsequent thereto are read by optical disc 1. Write operation at the point S is restarted from the latest valid sector address similarly at the time of the above-described track jump.

In this case, error flag from demodulating circuit 3 is already lost. Accordingly, in the case where correction is repeatedly carried out, since there exists no error flag to which reference is made at the time of the second correction of outer code, ordinary correction using only outer parity is carried out in place of eraser correction. It is to be noted that outer code flag obtained by the second outer code correction is used for eraser correction of the second inner code correction.

By carrying out such a control, it becomes possible to correct correction inability portion for a second time without interrupting read-out operation from ring buffer memory 5 to video code buffer memory 5, i.e., without affecting picture decode/reproduction by any means. As long as there is margin in the data remaining quantity, it is possible to repeatedly correct correction inability portion by desired number of times. Thus, the error correcting ability can be improved.

The operation at the time of special reproduction will now be described. At special reproduction such as fast feed, fast return or rewinding, etc., e.g., only data of I picture on the optical disc 1 are read in order, and are reproduced. At this time, since inner code is interleaved, it is necessary to start read operation from the position preceding by the interleaving length from a desired sector. Moreover, with respect to end of read operation, it is necessary to excessively carry out read operation by the interleaving length from required last data. With respect to the time required for de-interleaving, there is no problem since data are continuously processed at the time of normal reproduction. However, in the special reproduction to repeat an operation to read out data of desired I picture at a high speed, this time constitutes main cause which makes it difficult to carry out high speed reproduction. Namely, this time constitutes cause to elongate reproduction time.

In view of the above, at the time of special reproduction, control circuit 74 controls ring buffer memory 5 or error correcting circuit 71, etc. so as to carry out only error correction by outer code, but not to carry out error correction by inner code. At the time of special reproduction, selector contacts 63, 64 of switch 62 are always switched to contact a side. Data outputted from buffer memory 61 is sent to ring buffer memory 5 and error correcting circuit 71 as described above. Thus, correction by outer code is carried out.

At the time of normal reproduction, data is read out from ring buffer memory 5 for a second time, and is sent to error correcting circuit 71, at which error correction by inner code is carried out. However, such error correction is not carried out at the time of special reproduction. Data is sent to video code buffer memory 10 similarly to that at the time of normal reproduction. At this time, it is not required that read pointer PZr is positioned backwardly of pointer PYr as shown in FIG. 11, and read-out operation can be therefore started immediately after pointer PXw.

As stated above, since de-interleaving is not carried out, it is possible to quickly send data from ring buffer memory 5 to video code buffer memory 10. Thus, high speed reproducing operation can be carried out. Since inner code correction is not carried out, the operation of this embodiment is disadvantageous to some extent from a viewpoint of error correcting ability. However, at the time of special reproduction, even if freezing of picture such that still picture is temporarily reproduced by error correction inability, such phenomenon is not so conspicuous. This hardly constitutes any hindrance from a viewpoint of practical use.

Figure 21:
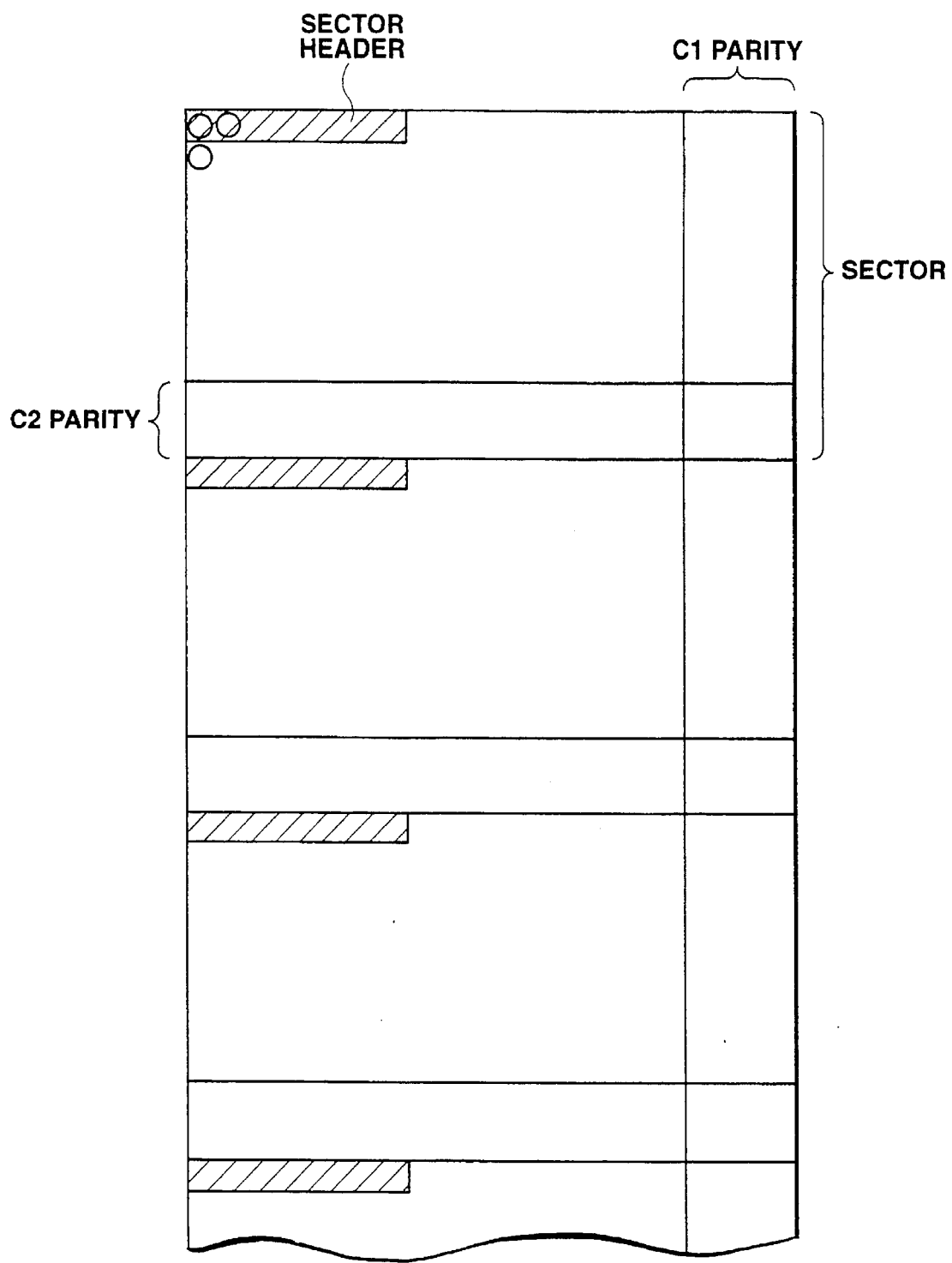
FIG. 21 is a view showing modification of data format of the data reproducing apparatus of this invention.

It is to be noted that error correction code may be product code of the completion type in place of convolution code (inner code and outer code). FIG. 21 shows an example of the format in the case where product code is used. In this embodiment, C1 parity is added to data in lateral direction of the figure, and C2 parity is added to data in longitudinal direction. Also with respect to data of such a format, this invention can be applied thereto by changing write and read addresses with respect to ring buffer memory 5.

While explanation has been given in connection with the case where the data reproducing method of this invention is applied to optical disc apparatus, this invention may be applied not only to optical disc apparatus, but also to, e.g., magneto-optical disc apparatus, etc.

In addition, this invention may be applied not only to the case where moving picture data is reproduced, but also to the case where speech data, or data in which moving picture data and speech data are multiplexed is reproduced.

What is claimed is:

1. A data reproducing method for reproducing data recorded on a disc as video data displayable as a picture, comprising the steps of:

reproducing said data from said disc using a pick-up, the reproduced data including two systems of error correction codes;

storing the data reproduced from said disc in a memory;

carrying out error correction of the data stored in said memory on the basis of said two systems of error correction codes;

detecting an error correction inability which indicates that error correction cannot be carried out using said two systems of error correction codes; and track jumping said pick-up along said disc when said error correction inability for said two systems of error correction codes is detected, thereby preventing a disturbance in said picture from arising when error correction cannot be carried out.

2. The data reproducing method according to claim 1, wherein the data stored in said memory is arranged in rows in a lateral direction, an interleaving direction being oblique to said lateral direction; and wherein said two systems of error correction codes are a first error correction signal generated by interleaving said data stored in said memory along said interleaving direction and a second error correction code generated using a technique other than said interleaving.

3. The data reproducing method according to claim 1, further comprising the step of carrying out error correction of the data stored in said memory once again when said error correction inability is detected.

4. The data reproducing method according to claim 1, wherein a synchronizing signal which represents a period of reproduction is appended to each predetermined length portion of said data, which portion includes said two systems of error correction codes, further comprising the steps of:

writing said predetermined length portion of said data into said memory during said period of reproduction indicated by the synchronizing signal, error correcting errors in the data written into said memory using said two systems of error correction codes, and reading out the error-corrected data from said memory.

5. The data reproducing method according to claim 1, further comprising the step of product coding said two systems of error correction codes thereby producing a logical product of said two systems of error correction codes.

6. The data reproducing method according to claim 1, further comprising the step of error correcting said data read out from said memory during a special reproduction operation of said data recorded on said disc.

7. The data reproducing method according to claim 6, wherein the reproduced error corrected data includes a sector header; and further comprising the step of detecting a sector address from said sector header, whereby an error is indicated when said sector address is not detected, and track jumping said pick-up when said sector address is not detected.

8. The data reproducing method according to claim 7, further comprising the step of interpolating said sector address when said sector address is not detected within a valid time period predetermined by a continuity of sector addresses within the reproduced, error-corrected data.

9. The data reproducing method according to claim 1, wherein said step of storing the reproduced data in a memory stores the reproduced data in a dynamic random access memory.

10. A data reproducing apparatus for reproducing data recorded on a disc as video data displayable as a picture, comprising:

reproducing means for reproducing said data from said disc using a pick-up, the reproduced data including two systems of error correction codes;

memory means for storing the data reproduced from said disc;

error correction means for carrying out error correction of the data stored in said memory means on the basis of said two systems of error correction codes;

detecting means for detecting an error correction inability which indicates that error correction cannot be carried out using said two systems of error correction codes; and track jumping means, responsive to said detecting means, for track jumping said pick-up along said disc when said detecting means detects said error correction inability for said two systems of error correction codes, thereby preventing a disturbance in said picture from arising when error correction cannot be carried out.

11. The data reproducing apparatus according to claim 10, wherein the data stored in said memory means is arranged in rows in a lateral direction, an interleaving direction being oblique to said lateral direction; and wherein said two systems of error correction codes are a first error correction signal generated by interleaving said data stored in said memory means along said interleaving direction and a second error correction code generated using a technique other than said interleaving.

12. The data reproducing apparatus according to claim 10, wherein the error correction means is operable to carry out error correction of the data stored in said memory means once again when said detecting means detects said error correction inability.

13. The data reproducing apparatus according to claim 10, wherein a synchronizing signal which represents a period of reproduction is appended to each predetermined length portion of said data, which portion includes said two systems of error correction codes, further comprising:

writing means for writing said predetermined length portion of said data into said memory means during said period of reproduction indicated by the synchronizing signal;

wherein said error correction means error corrects the data written into said memory means using said two systems of error correction codes during said period of reproduction indicated by the synchronizing signal; and reading means for reading out said error-corrected data from said memory means during said period of reproduction indicated by the synchronizing signal.

14. The data reproducing apparatus according to claim 10, further comprising means for product coding said two systems of error correction codes thereby producing a logical product of said two systems of error correction codes.

15. The data reproducing apparatus according to claim 10, wherein the error correction means error corrects said data read out from said memory means during a special reproduction operation of said data recorded on said disc.

16. The data reproducing apparatus according to claim 15, wherein the reproduced, error-corrected data includes a sector header; and further comprising means for detecting a sector address from said sector header, whereby an error is indicated when said sector address is not detected, and track jumping said pick-up when said sector address is not detected.

17. The data reproducing apparatus according to claim 16, further comprising means for interpolating said sector address when said sector address is not detected within a valid time period predetermined by a continuity of sector addresses within the reproduced and error-corrected data.

18. The data reproducing apparatus according to claim 10, wherein said memory means is a dynamic random access memory.

* * * * *